United States Patent
Schmidhammer et al.

(10) Patent No.: US 12,407,320 B2
(45) Date of Patent: Sep. 2, 2025

(54) BRIDGE FILTERS

(71) Applicant: RF360 SINGAPORE PTE. LTD., Singapore (SG)

(72) Inventors: Edgar Schmidhammer, Stein an der Traun (DE); Juha Sakari Ella, Salo (FI)

(73) Assignee: RF360 Singapore Pte. Ltd., Republic Plaza (SG)

( * ) Notice: Subject to any disclaimer, the term of this patent is extended or adjusted under 35 U.S.C. 154(b) by 326 days.

(21) Appl. No.: 17/661,197

(22) Filed: Apr. 28, 2022

(65) Prior Publication Data

US 2023/0353117 A1 Nov. 2, 2023

(51) Int. Cl.
 *H03H 7/42* (2006.01)
 *H03H 7/01* (2006.01)
 *H03H 7/38* (2006.01)
 *H03H 9/205* (2006.01)
 *H04B 1/40* (2015.01)

(52) U.S. Cl.
 CPC ............ *H03H 7/42* (2013.01); *H03H 7/0138* (2013.01); *H03H 7/38* (2013.01); *H03H 9/205* (2013.01); *H04B 1/40* (2013.01)

(58) Field of Classification Search
 CPC .......... H03H 7/42; H03H 7/0138; H03H 7/38; H03H 9/00–76
 See application file for complete search history.

(56) References Cited

U.S. PATENT DOCUMENTS

| | | | | |
|---|---|---|---|---|
| 8,350,643 | B2 * | 1/2013 | Inoue .................... | H03H 9/725 333/132 |
| 8,902,021 | B2 * | 12/2014 | Shin ....................... | H03H 9/542 333/133 |
| 10,177,714 | B1 | 1/2019 | McLaren et al. | |
| 11,750,167 | B2 * | 9/2023 | Zolomy .................. | H03H 7/38 333/17.3 |
| 2003/0060170 | A1 * | 3/2003 | Tikka ...................... | H03H 9/70 455/73 |

(Continued)

FOREIGN PATENT DOCUMENTS

| | | | | |
|---|---|---|---|---|
| CN | 113169754 A | * | 7/2021 | ........... H04B 1/0483 |
| DE | 3131038 A1 | | 7/1983 | |
| WO | WO-2019185285 A1 | * | 10/2019 | ........... H03H 9/0023 |

OTHER PUBLICATIONS

English translation of CN 113169754 (Year: 2024).*

(Continued)

*Primary Examiner* — Gennadiy Tsvey
(74) *Attorney, Agent, or Firm* — Loza & Loza LLP

(57) ABSTRACT

An apparatus is disclosed for bridge filters. In example aspects, the apparatus includes a filter circuit with a current balun and a filter core. The current balun includes a first terminal coupled to a first port of the filter circuit, a second terminal, a third terminal, and a fourth terminal. The current balun also includes a first inductor galvanically coupled between the first terminal and the second terminal. The current balun further includes a second inductor galvanically coupled between the third terminal and the fourth terminal. The filter core is coupled between the current balun and a second port of the filter circuit. The filter core is galvanically coupled to the second terminal of the current balun and to the fourth terminal of the current balun.

18 Claims, 12 Drawing Sheets

(56) References Cited

U.S. PATENT DOCUMENTS

| | | | |
|---|---|---|---|
| 2003/0128081 A1* | 7/2003 | Ella | H03H 9/0571 |
| | | | 333/133 |
| 2005/0212619 A1 | 9/2005 | Aigner et al. | |
| 2006/0061435 A1* | 3/2006 | Sul | H03H 9/0095 |
| | | | 333/191 |
| 2010/0109800 A1 | 5/2010 | Ueda et al. | |
| 2013/0285763 A1 | 10/2013 | Granger-Jones et al. | |
| 2013/0287144 A1 | 10/2013 | Paulin et al. | |
| 2015/0137869 A1* | 5/2015 | Akizuki | H03D 7/1458 |
| | | | 327/359 |
| 2017/0070205 A1 | 3/2017 | Hashemi et al. | |

OTHER PUBLICATIONS

English translation of DE 3131038 (Year: 2024).*
Partial International Search Report—PCT/SG2023/050268—ISA/EPO—Jul. 31, 2023.
"Microwaves101—Baluns", Retrieved at: https://www.microwaves101.com/encyclopedias/baluns—on Dec. 15, 2021, 3 pages.
Kerherve, et al., "BAW Technologies: Development and Applications within Martina, Mimosa and Mobilis Ist European Projects", Oct. 2006, pp. 341-350.
Bengal, et al., "Demystifying Transformers: Baluns and Ununs", Jul. 9, 2020, 12 pages.
Yu, et al., "Demystifying RF Transformers", Part 2: Baluns & Ununs, Jul. 28, 2020, 6 pages.
International Search Report and Written Opinion—PCT/SG2023/050268—ISA/EPO—Nov. 2, 2023, 21 pages.

* cited by examiner

BRIDGE FILTERS

TECHNICAL FIELD

This disclosure relates generally to signal communication or signal processing using an electronic device and, more specifically, to a bridge filter that is suitable for signal communication or processing.

BACKGROUND

Electronic devices include traditional computing devices such as desktop computers, notebook computers, smartphones, wearable devices like a smartwatch, internet servers, and so forth. Electronic devices also include other types of computing devices such as personal voice assistants (e.g., smart speakers), wireless access points or routers, thermostats and other automated controllers, robotics, automotive electronics, devices embedded in other machines like refrigerators and industrial tools, Internet of Things (IoT) devices, medical devices, and so forth. These various electronic devices provide services relating to productivity, communication, social interaction, security, health and safety, remote management, entertainment, transportation, and information dissemination. Thus, electronic devices play crucial roles in modern society.

Many of the services provided by electronic devices in today's interconnected world depend at least partly on electronic communications. Electronic communications can include, for example, those exchanged between two or more electronic devices using wireless or wired signals that are transmitted over one or more networks, such as the Internet, a Wi-Fi® network, or a cellular network. Electronic communications can therefore include wireless or wired transmissions and receptions. To transmit and receive communications, an electronic device can use a transceiver, such as a wireless transceiver that is designed for wireless communications.

Electronic communications can be realized by propagating signals between two wireless transceivers at two different electronic devices. For example, using a wireless transmitter, a smartphone can transmit a wireless signal to a base station over the air as part of an uplink communication to support mobile services. Using a wireless receiver, the smartphone can receive a wireless signal that is transmitted from the base station via the air medium as part of a downlink communication to enable mobile services. With a smartphone, such mobile services can include making voice and video calls, participating in social media interactions, sending messages, watching movies, sharing videos, performing searches, using map information or navigational instructions, finding friends, engaging in location-based services generally, transferring money, obtaining another service like a car ride, and so forth.

Many of these mobile services depend at least partly on the transmission or reception of wireless signals between two or more electronic devices. Consequently, researchers, electrical engineers, and designers of electronic devices strive to develop wireless transceivers that can use wireless signals effectively to provide these and other mobile services.

SUMMARY

A wireless transceiver or a radio-frequency (RF) front-end can include a filter that passes the desired frequencies of a signal but suppresses the undesired ones. An example type of filter is the bridge filter. This document describes a bridge filter that can provide a wider passband in conjunction with greater out-of-band attenuation as compared to some other bridge filters. A described bridge filter example includes a filter core coupled between a first port and a second port. First coupling circuitry is coupled between the first port and the filter core, and second coupling circuitry is coupled between the filter core and the second port. Each coupling circuitry includes a respective current balun that converts between single-ended or unbalanced signaling and differential or balanced signaling. In example implementations of a filter circuit, a current balun includes two inductors, which may be implemented with coupled coils or coupled lines. A first inductor is galvanically coupled, at least within the current balun, between the first port and a terminal of the filter core. A second inductor is galvanically coupled, at least within the current balun, between a ground and another terminal of the filter core. The filter circuit including at least one current balun can have an increased bandwidth relative to a similar filter circuit with a voltage balun. In other implementations, a resonant circuit is coupled between a ground and a terminal of an inductor of the current balun. Further, in some cases, another inductor can be coupled between the two inductors of the current balun and across two balanced paths of the filter circuit. An example of a bridge filter is a lattice filter. Accordingly, the filter core can be constructed using a lattice filter architecture with multiple resonators, and each resonator may include one or more acoustic wave resonators.

In an example aspect, an apparatus for filtering signals is disclosed. The apparatus includes a filter circuit. The filter circuit includes a current balun and a filter core. The current balun includes a first terminal coupled to a first port of the filter circuit, a second terminal, a third terminal, and a fourth terminal. The current balun also includes a first inductor galvanically coupled between the first terminal and the second terminal and a second inductor galvanically coupled between the third terminal and the fourth terminal. The filter core is coupled between the current balun and a second port of the filter circuit. The filter core is galvanically coupled to the second terminal of the current balun and to the fourth terminal of the current balun.

In an example aspect, an apparatus for filtering signals is disclosed. The apparatus includes a filter circuit. The filter circuit includes a first port, a second port, a current balun, and a filter core coupled between the first port and the second port. The current balun includes first means for galvanically coupling the filter core to the first port and second means for galvanically coupling the filter core to a ground.

In an example aspect, a method for operating a filter is disclosed. The method includes galvanically routing a first signal component of a first signal from a first port of the filter circuit to a first terminal of a filter core. The method also includes electromagnetically routing a second signal component of the first signal from the first port to a second terminal of the filter core. Regarding the filter core, the method includes propagating at least a portion of the first signal component through at least one first resonator of the filter core and propagating at least a portion of the second signal component through at least one second resonator of the filter core. The method additionally includes electromagnetically routing the at least a portion of the first signal component from a third terminal of the filter core to a second port of the filter circuit as a part of a second signal. The method further includes galvanically routing the at least a portion of the second signal component from a fourth terminal of the filter core to the second port of the filter circuit as another part of the second signal.

In an example aspect, an apparatus for filtering signals is disclosed. The apparatus includes a filter circuit. The filter circuit includes a first port and a second port. The filter circuit also includes a filter core coupled between the first port and the second port, with the filter core including a bridge filter having at least four acoustic wave resonators. The filter circuit further includes a first current balun coupled between the first port and the filter core and a second current balun coupled between the second port and the filter core.

BRIEF DESCRIPTION OF DRAWINGS

FIG. 2-1 is a schematic diagram illustrating an example radio-frequency (RF) front-end and an example transceiver that can each include at least one filter circuit.

FIG. 2-2 is a schematic diagram illustrating an example RF front-end (RFFE) that can include one or more filter circuits coupled between at least one antenna and one or more amplifiers.

FIG. 5-1 is a circuit diagram illustrating a filter circuit including an example matching network coupled between a port and coupling circuitry that has a current balun.

FIGS. 7-1 to 7-3 are schematic diagrams of example resonators that each include at least one acoustic wave resonator.

DETAILED DESCRIPTION

Introduction and Overview

Figure 1:
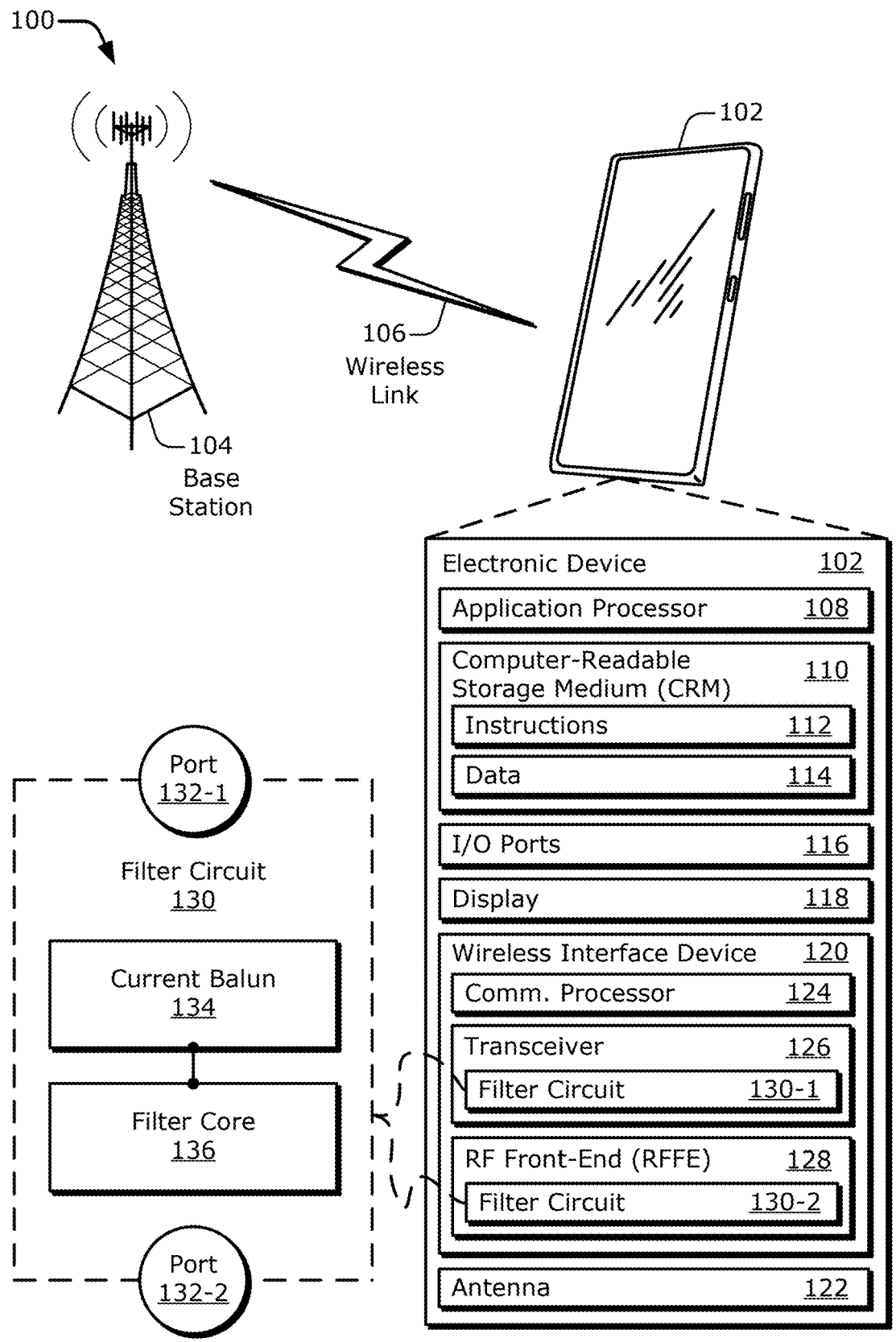
FIG. 1 illustrates an environment with an example electronic device that has a wireless interface device, which includes at least one example filter circuit.

To facilitate transmission and reception of wireless signals, an electronic device can use a wireless interface device that includes a wireless transceiver and/or a radio-frequency (RF) front-end. Electronic devices communicate with wireless signals using electromagnetic (EM) signals in various frequencies that exist on a portion of the EM spectrum. These wireless signals may travel between two electronic devices at a particular frequency, such as a kilohertz (kHz) frequency, a megahertz (MHz) frequency, or a gigahertz (GHz) frequency. The EM spectrum is, however, a finite resource that limits how many signals can be simultaneously communicated in any given spatial area. There are already billions of electronic devices that use this limited resource. To enable a greater number of simultaneous communications using EM signaling, the finite EM spectrum is shared among electronic devices. The EM spectrum can be shared using, for instance, frequency-division multiplexing (FDM) and/or time-division multiplexing (TDM) techniques.

Techniques for FDM can entail separating the EM spectrum into different frequency bands and constraining communications to occur within an assigned frequency band. Techniques for TDM can entail segmenting a block of time into different periods and constraining communications to occur within an assigned time period. Signals in different frequency bands can be communicated at the same time in a same area without significantly interfering with each other. To transmit a signal within a target frequency band, a transmitter can apply a filter to the signal. The filter passes the frequencies of the target frequency band and suppresses (e.g., attenuates, reduces, or blocks) other frequencies.

Filters are also used to receive signals by suppressing undesired frequencies in a received signal to at least partially "isolate" or "extract" the desired frequency range(s). Techniques for TDM separate signals by time, but filters are still used with TDM signal processing because wireless devices can communicate simultaneously over many different frequency bands. Although filters support FDM and/or TDM techniques to facilitate efficient sharing of the EM spectrum, filters can create difficulties with electronic devices that communicate wirelessly. These difficulties can relate to increasing the cost or size of electronic devices and/or introducing one or more errors in a signal being processed.

Thus, a wireless transceiver or an RF front-end of an electronic device can include a filter that passes the desired frequencies of a signal within a target frequency band but suppresses the undesired ones outside of the band. Some filters use combinations of inductors and capacitors to suppress frequencies. Other filters use acoustic resonators, like a bulk acoustic wave (BAW) resonator or a surface acoustic wave (SAW) resonator, to filter frequencies using a piezoelectric material. Each acoustic resonator may be associated with a resonant frequency that corresponds to which frequency or frequencies can be passed or suppressed using the acoustic resonator. Still other filters use inductors in conjunction with capacitors and acoustic resonators.

Filters can also include one or more baluns to process or convert between balanced and unbalanced signals. Filters can therefore use baluns, acoustic resonators, capacitors, and/or inductors to achieve a desired filter response. Cost and size may be factors to consider when designing filters. Filters, however, are expected to meet certain operational parameters, such as frequency response, noise suppression, in-band performance, out-of-band suppression, and so forth. Implementations for filters that are described below can provide good operational characteristics while attaining reasonable costs and sizes.

With Fifth-Generation (5G) and forthcoming Sixth-Generation (6G) technologies, filters providing relatively wide bandwidths are to be used. Generally, a wireless transceiver or an RF front-end can include a filter that passes the desired frequencies of a signal but suppresses the undesired ones. It is challenging, however, to attain the expected wide bandwidths of 5G and 6G technologies given that commonly employed ladder filters offer a bandwidth that is limited by existing resonator technology. With ladder-type filter designs, it is also difficult to select the number and position of finite transmission zeros (FTZs), which can control the frequencies that are blocked by a filter. Further, the expected linearity and power handling specifications for 5G and 6G devices may not be achievable with ladder filters.

Bridge filters, in contrast, can provide wide bandwidths combined with superior out-of-band attenuation levels using existing resonator technology. With a given micro-acoustic resonator technology, the large-signal capabilities (e.g., power handling and linearity) of a bridge filter are superior compared to those of widely used ladder-type architectures. An example type of a bridge filter is a lattice filter. Lattice-type filters can operate with good linearity. Some lattice filters employ a cross-over, or "X-shaped," circuit architecture that is bookended by two baluns. Although lattice filters can meet some of the expectations for 5G and future 6G technologies, such lattice filters may be unable to meet specified signal-processing error constraints. For example, some lattice filters may produce magnitude (e.g., amplitude or intensity) errors and/or phase (e.g., angle or timing) errors that exceed operational parameters that are relevant to 5G and 6G technologies.

This document describes bridge filters that can provide a wider passband in conjunction with greater out-of-band attenuation as compared to some other bridge filters by, e.g., generating relatively lower magnitude and/or phase errors during signal processing. A described bridge filter example includes a filter core coupled between a first port and a second port. First coupling circuitry is coupled between the first port and the filter core, and second coupling circuitry is coupled between the filter core and the second port. Each coupling circuitry includes a respective current balun that converts between signaling that is single-ended or unbalanced and signaling that is differential or balanced.

In example implementations of a filter circuit, a current balun includes two inductors. A first inductor is galvanically coupled, at least within the current balun, between the first port and a terminal of the filter core. A second inductor is galvanically coupled, at least within the current balun, between a ground and another terminal of the filter core. Thus, the filter core is galvanically coupled to two inductors of the current balun. The two inductors can be realized using, for example, two wire-wound inductive elements, two spiral inductive elements, or two edge-coupled or broadside-coupled transmission lines. As used herein, a "galvanic" coupling refers to an electrical coupling that need not rely on an electromagnetic coupling for signal communication. For example, a galvanic coupling can produce an ohmic or resistive effect between two nodes, e.g., in response to even a direct-current (DC) current. An inductor that is galvanically coupled between two terminals or two components can be capable of carrying a direct-current (DC) current between the two terminals or the two components. The filter circuit including at least one current balun can have an increased bandwidth and steeper skirts relative to a similar filter circuit with a voltage balun. The out-of-band suppression can also be stronger.

In other implementations, a resonant circuit is coupled between a ground and a terminal of an inductor of the current balun. The resonant circuit can include a capacitor coupled in parallel with an inductor. Additionally or alternatively, the resonant circuit can be formed using at least one transmission line, such as a quarter-wavelength microstrip stub. Further, in some cases, another inductor can be coupled between the two inductors of the current balun and across two balanced paths of the filter circuit.

Generally, a bridge filter can include two balanced paths to propagate differential signals through the filter core. As mentioned above, a lattice filter is an example of a bridge filter. Accordingly, the filter core can be constructed using a lattice filter architecture with an "X" or cross-coupled design across two balanced paths. The lattice filter architecture can include multiple resonators, and each resonator may include one or more acoustic wave resonators. Each resonator can be realized with an acoustic resonator arrangement including one or more acoustic wave resonators. With multiple (e.g., two, three, or more) acoustic resonators within an acoustic resonator arrangement, the multiple acoustic resonators may be arranged in series, in parallel, or in a series-parallel combination.

Filters can benefit from producing low errors in terms of the phase and amplitude of propagating signals to provide a defined passband for in-band performance and good frequency rejection for out-of-band performance. Using at least one current balun can result in a relatively lower magnitude and/or phase error of the filtered signal as compared to using a voltage balun. The current balun can cause approximately equal currents to flow in the balanced paths of the filter core, which reduces the nonlinear effects from some resonators of the filter core to thereby lower the magnitude and phase errors. Including the "additional" inductor across the balanced lines can further compensate for errors introduced by acoustic resonators. Including a resonant circuit at a terminal of one of the inductors of the current balun can further increase the bandwidth provided by the current balun. In any of these manners, employing a current balun in a bridge filter can widen a passband, increase out-of-band suppression, steepen filter skirts, and/or reduce signal errors resulting from the filtering.

Description Examples

FIG. 1 illustrates an example environment 100 with an electronic device 102 that has a wireless interface device 120, which includes at least one example filter circuit 130. This document describes example implementations of the filter circuit 130, which may be part of a transceiver, a radio-frequency front-end (RFFE), and so forth of an apparatus. In the environment 100, the example electronic device 102 communicates with a base station 104 through a wireless link 106. In FIG. 1, the electronic device 102 is depicted as a smartphone. The electronic device 102, however, may be implemented as any suitable computing or other electronic device. Examples of an apparatus that can be realized as an electronic device 102 include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, another electronic device as described above generally, and so forth. Hence, the wireless link 106 can extend between the electronic device 102 and the base station 104 in any of various manners.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a 3rd Generation Partnership Project (3GPP) Long-Term Evolution (LTE) standard, such as a 4th Generation (4G), a 5th Generation (5G), or a 6th Generation (6G) cellular standard; an IEEE 802.11 standard, such as 802.11g, ac, ax, ad, aj, or ay standard (e.g., Wi-Fi® 6 or WiGig®); an IEEE 802.16 standard (e.g., WiMAX®); a Bluetooth® standard; an ultra-wideband (UWB) standard (e.g., IEEE 802.15.4); and so forth. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similarly to or differently from the wireless link 106. The wireless interface device 120 may facilitate communication over any suitable type of wireless network, such as a wireless local area network (LAN) (WLAN), wireless personal-area-network (PAN) (WPAN), peer-to-peer (P2P) network, mesh network, cellular network, wireless wide-area-network (WAN) (WWAN), and/or navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like. Also, as described above, an electronic device 102 may alternatively be implemented as a base station 104 or another apparatus as set forth herein.

As shown, the wireless interface device 120 can include at least one communication processor 124, at least one transceiver 126, and at least one radio-frequency front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or a processor generally can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals transmitted or received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include or be associated with a memory (not separately depicted) to store data and processor-executable instructions (e.g., code), such as the same or another CRM 110.

As shown, the wireless interface device 120 can include at least one filter circuit 130, which is described below. More specifically, the transceiver 126 can include at least one filter circuit 130-1, or the RF front-end 128 can include at least one filter circuit 130-2 (including both components can have at least one filter circuit 130 in accordance with an optional but permitted inclusive-or interpretation of the word "or"). The transceiver 126 can also include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a super-heterodyne architecture). Generally, the transceiver 126 can include filters, switches, amplifiers, mixers, and so forth for routing and conditioning signals that are transmitted or received via the antenna 122.

In addition to the filter circuit 130-1, the transceiver 126 can include an analog-to-digital converter (ADC) or a digital-to-analog converter (DAC) (not shown in FIG. 1). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figures 1, 2:
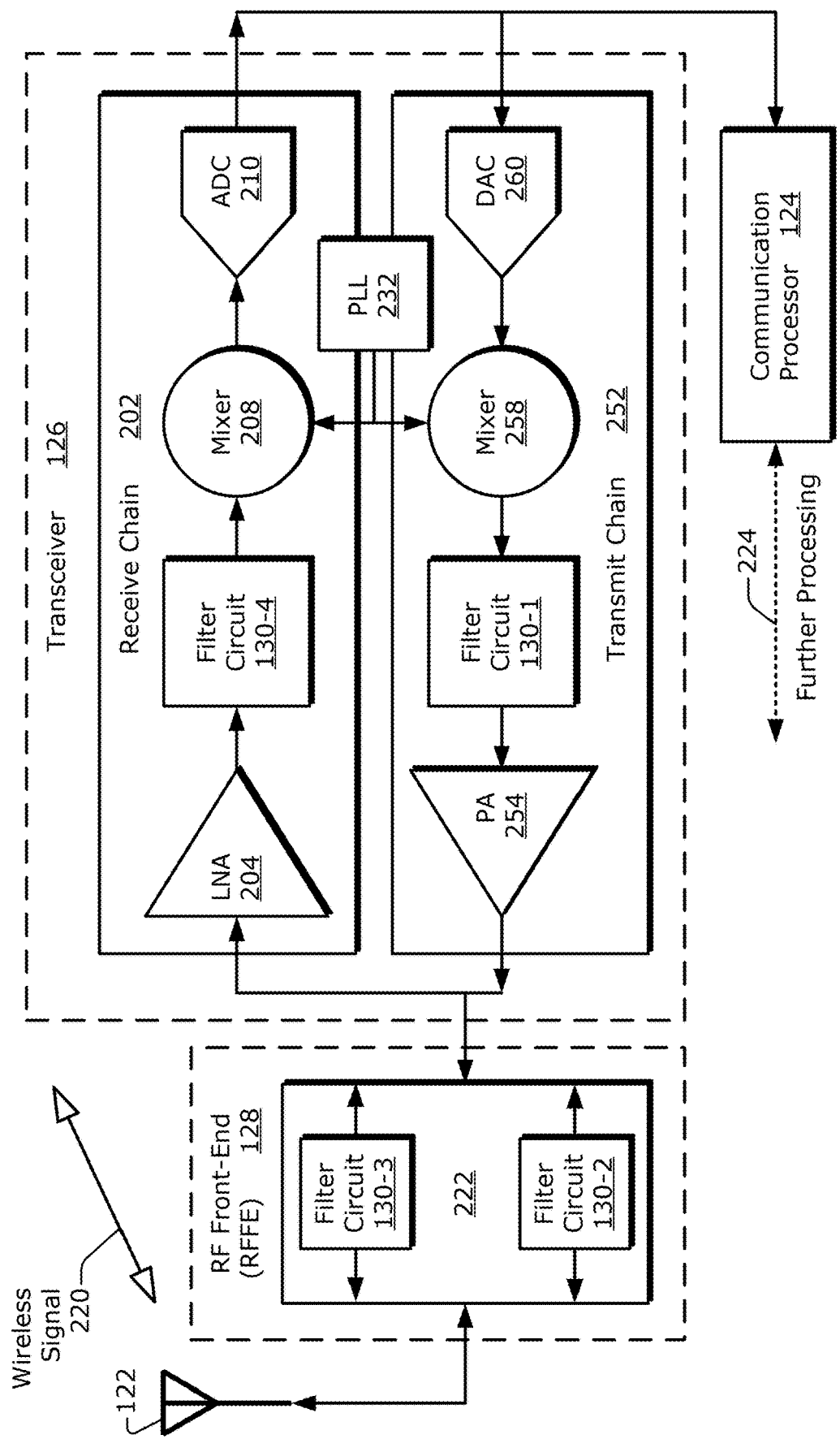
Figure 2:
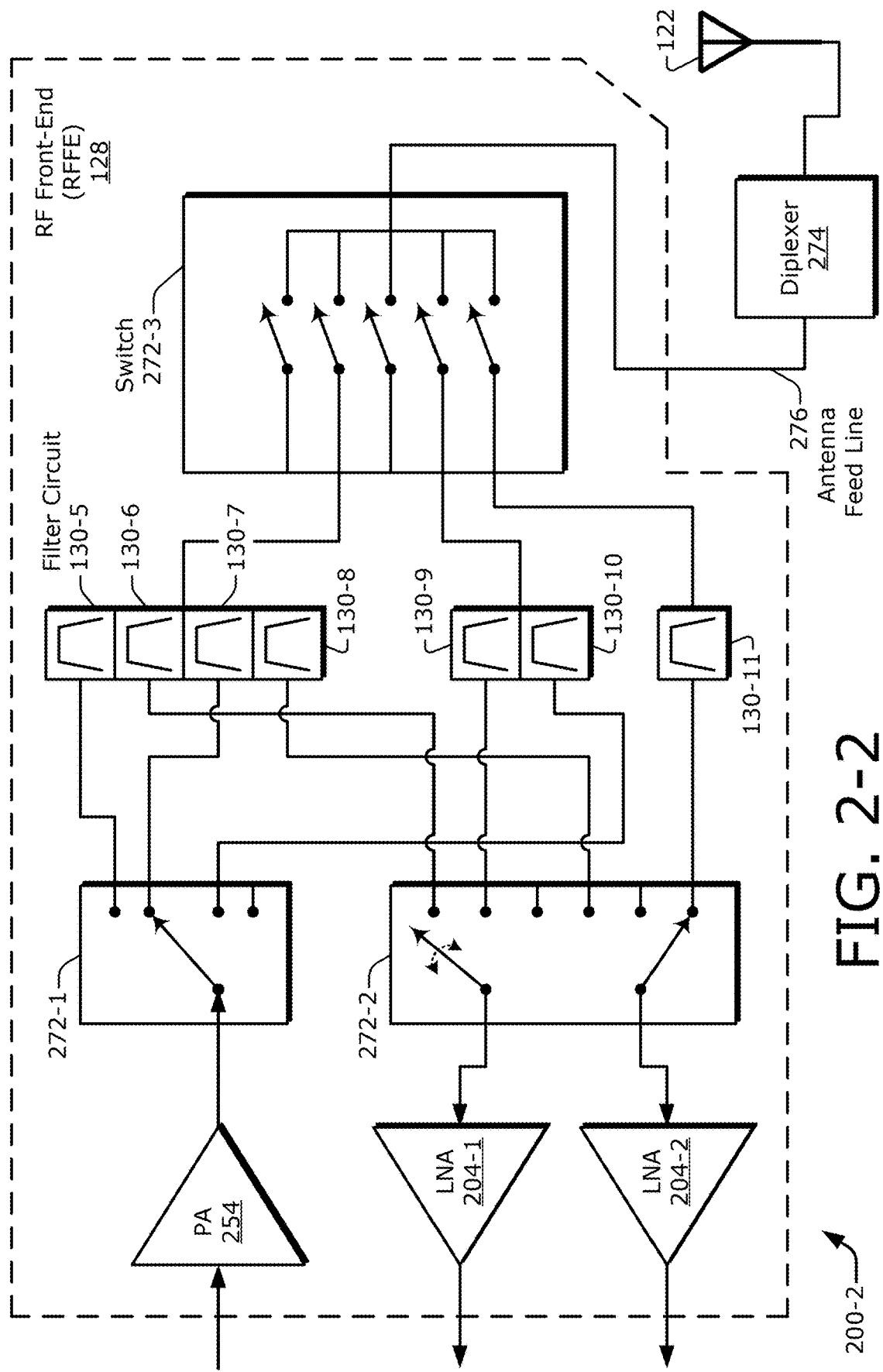

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters-such as the filter circuit 130-2-multiple switches, or one or more amplifiers for conditioning signals received via the antenna 122 or for conditioning signals to be transmitted via the antenna 122. The RF front-end 128 may also include a phase shifter (PS), peak detector, power meter, gain control block, antenna tuning circuit, N-plexer, balun, and the like. Configurable components of the RF front-end 128, such as some phase shifters, an automatic gain controller (AGC), or a reconfigurable version of the filter circuit 130, may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, an example filter circuit 130 is depicted as being part of a transceiver 126 as a filter circuit 130-1, as being part of an RF front-end 128 as a filter circuit 130-2, and so forth. Described implementations of a filter circuit 130 can, however, additionally or alternatively be employed in other portions of the wireless interface device 120 or in other portions of the electronic device 102 generally. As set forth above, a filter circuit 130 can be included in an electronic device other than a cell phone, such as a base station 104. With a base station (or a mobile phone), a filter of, e.g., an intermediate frequency (IF) section of a wireless interface device 120 and/or an RF front-end 128 may include a filter circuit 130 as described herein. Other electronic device apparatuses that can employ a filter circuit 130 include a laptop, communication hardware of a vehicle, a wireless access point, and so forth as described herein.

In example implementations, the filter circuit 130 can include at least one port 132, at least one current balun 134, and at least one filter core 136. As illustrated, the filter circuit 130 can include a first port 132-1 and a second port 132-2. In some cases, one port can operate as an input port, and the other port can operate as an output port for the filter circuit 130. These input/output statuses may be switched during operation, however, for a bidirectional filter circuit 130. Although two ports 132-1 and 132-2, one current balun 134, and one filter core 136 are explicitly depicted in FIG. 1, the filter circuit 130 may include fewer or more of any of such components, as well as other components that are not shown.

Figure 3:
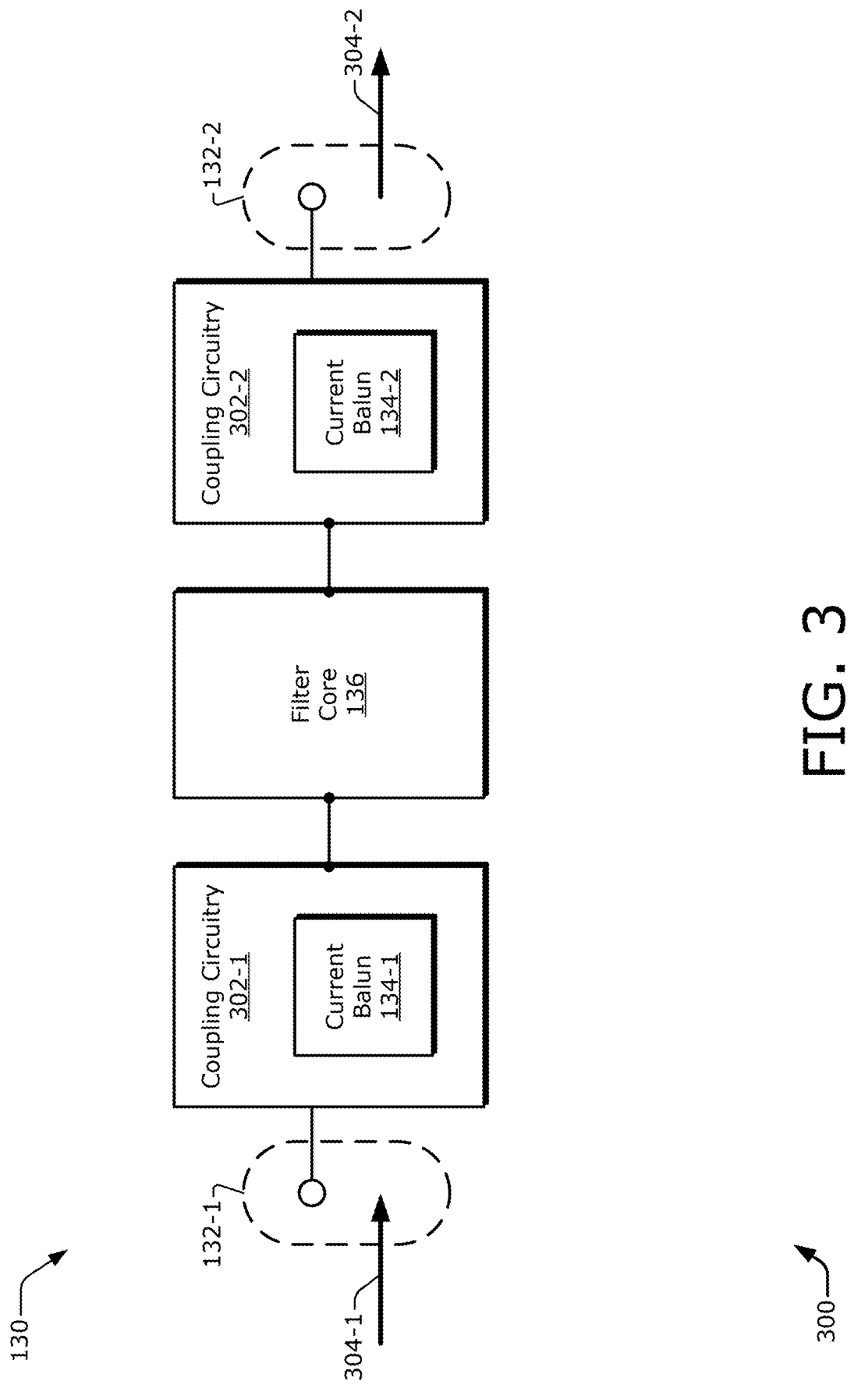
FIG. 3 is a schematic diagram illustrating an example filter circuit including a filter core and two instances of coupling circuitry, each with a respective current balun.

Using a filter circuit architecture that includes at least one current balun 134 as is described herein, the filter circuit 130 can operate with a wider bandwidth and/or with greater out-of-band suppression as compared to an architecture having a voltage balun. Example implementations for such filter circuits with one or more current baluns are described below with reference to at least FIGS. 3 to 6. As depicted in FIGS. 3 and 6, two current baluns can be symmetrically deployed around the filter core 136 for the two respective ports. As shown in FIG. 6, the filter core 136 can be realized, by way of example only, with a lattice filter implementation of a bridge filter architecture.

Further, an inductor can be coupled across respective terminals of two inductors of the current balun 134. Additionally or alternatively, a resonant circuit, such as one with an inductive-capacitive component, can be coupled between a ground and a terminal of an inductor of the current balun 134. Example implementations for such filter circuits with an additional parallel inductor and/or a shunt resonant circuit are described below with reference to at least FIGS. 5 to 6. Next, however, this document describes example implementations of a transceiver and an RF front-end with reference to FIGS. 2-1 and 2-2.

FIG. 2-1 is a schematic diagram 200-1 illustrating an example RF front-end 128 and an example transceiver 126 that can each include at least one filter circuit 130. FIG. 2-1 also depicts an antenna 122 and a communication processor 124. The communication processor 124 communicates one or more data signals to other components, such as the application processor 108 of FIG. 1, for further processing at 224 (e.g., for processing at an application level). As shown, the circuitry 200-1 can include a filter circuit 130-1, a filter circuit 130-2, a filter circuit 130-3, or a filter circuit 130-4, including one to four of such filter circuits. The circuitry 200-1, however, may include a different quantity of filters (e.g., more or fewer), may include filters that are coupled together differently, may include filters in different locations, may include filters that are implemented as a duplexer or quadplexer, and so forth.

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one signal propagation path 222. The at least one signal propagation path 222 can include at least one filter circuit 130, such as the filter circuit 130-2 and the filter circuit 130-3. The example transceiver 126 includes at least one receive chain 202 (or receive path 202) and at least one transmit chain 252 (or transmit path 252). Although only one RF front-end 128, one transceiver 126, and one communication processor 124 are shown at the circuitry 200-1, an electronic device 102, or a wireless interface device 120 thereof, can include multiple instances of any or all such components. Also, although only certain components are explicitly depicted in FIG. 2 and are shown coupled together in a particular manner, the transceiver 126 or the RF front-end 128 may include other non-illustrated components (e.g., switches or diplexers), more or fewer components, differently coupled arrangements of components, and so forth.

In some implementations, the RF front-end 128 couples the antenna 122 to the transceiver 126 via the signal propagation path 222. In operation, the signal propagation path 222 carries a signal between the antenna 122 and the transceiver 126. During or as part of the signal propagation, the signal propagation path 222 conditions the propagating signal, such as with the filter circuit 130-2 or the filter circuit 130-3. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2-1, an RF front-end 128, or a signal propagation path 222 thereof, may include one or more other components, such as another filter, an amplifier (e.g., a power amplifier or a low-noise amplifier), an N-plexer, a phase shifter, a diplexer, one or more switches, and so forth.

In some implementations, the transceiver 126 can include at least one receive chain 202, at least one transmit chain 252, or at least one receive chain 202 and at least one transmit chain 252. From left to right, the receive chain 202 can include a low-noise amplifier 204 (LNA 204), the filter circuit 130-4, a mixer 208 for frequency down-conversion, and an ADC 210. The transmit chain 252 can include a power amplifier 254 (PA 254), the filter circuit 130-1, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically or electromagnetically disposed anywhere along the depicted receive and transmit chains.

The receive chain 202 is coupled between the signal propagation path 222 of the RF front-end 128 and the communication processor 124—e.g., via the low-noise amplifier 204 and the ADC 210, respectively. The transmit chain 252 is coupled between the signal propagation path 222 and the communication processor 124—e.g., via the power amplifier 254 and the DAC 260, respectively. The transceiver 126 can also include at least one phase-locked loop 232 (PLL 232) that is coupled to the mixer 208 or the mixer 258. For example, the transceiver 126 can include one PLL 232 for each transmit/receive chain pair, one PLL 232 per transmit chain and one PLL 232 per receive chain, multiple PLLs 232 per chain, and so forth.

As shown along a signal propagation direction for certain example implementations of the receive chain 202, the antenna 122 is coupled to the low-noise amplifier 204 via the signal propagation path 222 and the filter circuit 130-3 thereof, and the low-noise amplifier 204 is coupled to the filter circuit 130-4. The filter circuit 130-4 is coupled to the mixer 208, and the mixer 208 is coupled to the ADC 210. The ADC 210 is in turn coupled to the communication processor 124. As shown along a signal propagation direction for certain example implementations of the transmit chain 252, the communication processor 124 is coupled to the DAC 260, and the DAC 260 is coupled to the mixer 258. The mixer 258 is coupled to the filter circuit 130-1, and the filter circuit 130-1 is coupled to the power amplifier 254. The power amplifier 254 is coupled to the antenna 122 via the signal propagation path 222 using the filter circuit 130-2 thereof. Although only one receive chain 202 and one transmit chain 252 are explicitly shown, an electronic device 102, or a transceiver 126 thereof, can include multiple instances of either or both components. Although the ADC 210 and the DAC 260 are illustrated as being separately coupled to the communication processor 124, they may share a bus or other means for communicating with the processor 124.

As part of an example signal-receiving operation, the filter circuit 130-3 of the signal propagation path 222 filters a received signal and forwards the filtered signal to the low-noise amplifier 204. The low-noise amplifier 204 accepts the filtered signal from the RF front-end 128 and provides an amplified signal to the filter circuit 130-4 based on the accepted signal. The filter circuit 130-4 filters the amplified signal and provides another filtered signal to the mixer 208. The mixer 208 performs a frequency conversion operation on the other filtered signal to down-convert from one frequency to a lower frequency (e.g., from a radio frequency (RF) to an intermediate frequency (IF) or to a baseband frequency (BBF)). The mixer 208 can perform the frequency down-conversion in a single conversion step or through multiple conversion steps using at least one PLL 232. The mixer 208 can provide a down-converted signal to the ADC 210 for conversion and forwarding to the communication processor 124 as a digital signal.

As part of an example signal-transmitting operation, the mixer 258 accepts an analog signal at BBF or IF from the DAC 260. The mixer 258 upconverts the analog signal to a higher frequency, such as to an RF frequency, to produce an RF signal using a signal generated by the PLL 232 to have a target synthesized frequency. The mixer 258 provides the RF or other upconverted signal to the filter circuit 130-1. The filter circuit 130-1 filters the RF signal and provides a filtered signal to the power amplifier 254. Thus, after the filtering by the filter circuit 130-1, the power amplifier 254 amplifies the filtered signal and provides an amplified signal to the signal propagation path 222 for signal conditioning. The RF front-end 128 can use, for instance, the filter circuit 130-2 of the signal propagation path 222 to provide a filtered signal to the antenna 122 for emanation as a wireless signal 220.

Example implementations of a filter circuit 130, as described herein, may be employed at any one or more of the example filter circuits 130-1, 130-2, 130-3, or 130-4 in the transceiver 126 and the RF front-end 128 or at other filters of an electronic device 102 (not shown in FIG. 2-1). The circuitry 200-1, however, depicts just some examples for a transceiver 126 and/or an RF front-end 128. In some cases, the various components that are illustrated in the drawings using separate schematic blocks or circuit elements may be manufactured or packaged in different discrete manners. For example, one physical module may include components of the RF front-end 128 and some components of the transceiver 126, and another physical module may combine the communication processor 124 with the remaining components of the transceiver 126. Further, in some cases, the antenna 122 may be co-packaged with at least some components of the RF front-end 128 or the transceiver 126.

In alternative implementations, one or more components may be physically or logically "shifted" to a different part of the wireless interface device 120 as compared to the illustrated circuitry 200-1 and/or may be incorporated into a different module. For example, a low-noise amplifier 204 or a power amplifier 254 may alternatively or additionally be deployed in the RF front-end 128. Examples of this alternative are described next with reference to FIG. 2-2.

FIG. 2-2 is a schematic diagram 200-2 illustrating an example RF front-end 128 that can include one or more filter circuits coupled between at least one antenna 122 and one or more amplifiers, such as at least one low-noise amplifier (LNA) or at least one power amplifier (PA). As illustrated, the RF front-end 128 is coupled to the antenna 122 via an antenna feed line 276. Between the RF front-end 128 and the antenna 122, the antenna feed line 276 may include one or more components, such as a diplexer 274 (or a duplexer in some implementations where transmit (Tx) and receive (Rx) operations share the antenna 122). The RF front-end 128 can include a power amplifier 254, a first low-noise amplifier 204-1, and a second low-noise amplifier 204-2.

The RF front-end 128 can also include multiple switches, such as a first switch 272-1, a second switch 272-2, and a third switch 272-3. The first switch 272-1 is coupled along a transmit path of a signal propagation path 222 (of FIG. 2-1)

of the RF front-end 128, and the second switch 272-2 is coupled along a receive path of another signal propagation path 222. The third switch 272-3 is coupled along the transmit path and the receive path. Multiple transmit or receive signal propagation paths may be established at the same time or at different times using the switches.

In example implementations, the RF front-end 128 can further include multiple filter circuits, such as seven filter circuits 130-5 to 130-11. The three filter circuits 130-5, 130-7, and 130-10 can be used as part of a transmit path between the power amplifier 254 and the antenna 122, with the transmit path including the antenna feed line 276. The four filter circuits 130-6, 130-8, 130-9, and 130-11 can be used as part of a receive path between the antenna 122 and a low-noise amplifier 204, such as the first low-noise amplifier 204-1 or the second low-noise amplifier 204-2. Thus, the three filter circuits 130-5, 130-7, and 130-10 can filter a transmit signal that is output by the power amplifier 254. On the other hand, the four filter circuits 130-6, 130-8, 130-9, and 130-11 can filter a receive signal before the receive signal is input to the first or second low-noise amplifier 204-1 or 204-2.

Each filter circuit 130 can be realized as a standalone filter, a duplexer, a quadplexer, and so forth. As shown, the filter circuit 130-11 can operate as a standalone filter. The two filter circuits 130-9 and 130-10 can operate as a duplexer. The four filter circuits 130-5, 130-6, 130-7, and 130-8 can be configured as a quadplexer. By way of example only, the switch 272-2 is shown in a state in which the filter circuit 130-11 is coupled to an input of the second low-noise amplifier 204-2. The filter circuits, switches, amplifiers, and signal propagation paths can, however, be realized or operationally configured in different manners.

The transmit and receive paths can be established using one or more of the first, second, or third switches 272-1, 272-2, or 272-3. A controller (not shown), which may be part of the communication processor 124 (of FIGS. 1 and 2-1), can position or set the states of these switches based on transmit versus receive mode, a frequency being used for transmission or reception, and so forth. Although certain components are depicted in FIG. 2-2 in certain arrangements and described above in a particular manner, an RF front-end 128 can include different components, more or fewer components, different couplings or arrangements of the components, and so forth.

FIG. 3 is a schematic diagram 300 illustrating an example filter circuit 130 including a filter core 136 and two instances of coupling circuitry 302, each with a respective current balun 134. As shown, the filter circuit 130 can include at least one filter core 136 and at least two ports: a first port 132-1 and a second port 132-2. The filter circuit 130 also includes an instance of first coupling circuitry 302-1 having a first current balun 134-1 and an instance of second coupling circuitry 302-2 having a second current balun 134-2. Each port 132 may include at least one terminal, one of which is depicted as a circle for each port 132 in FIG. 3.

With the filter circuit 130, the first port 132-1 and the second port 132-2 are each implemented as an unbalanced or single-ended port. Thus, the two ports 132-1 and 132-2 can propagate (or couple) unbalanced or single-ended signals from another component to an instance of the coupling circuitry 302 or from another instance of the coupling circuitry 302 to another component. One terminal of each port 132 in FIG. 3 is used to carry the single-ended signal. Another terminal (not shown in FIG. 3) of each port 132 can be coupled to a ground.

In example implementations, the filter core 136 is coupled between the first port 132-1 and the second port 132-2. The first coupling circuitry 302-1 is coupled between the first port 132-1 and the filter core 136. Thus, the first current balun 134-1 is coupled between the first port 132-1 and the filter core 136. Similarly, the second coupling circuitry 302-2 is coupled between the second port 132-2 and the filter core 136, and the second current balun 134-2 is coupled between the second port 132-2 and the filter core 136.

Generally, a signal 304 can enter or exit the filter circuit 130 via the first port 132-1 or the second port 132-2. As shown in FIG. 3, a first signal 304-1 enters the filter circuit 130 via the first port 132-1, and a second signal 304-2 exits the filter circuit 130 via the second port 132-2. Thus, in the depicted example, the first port 132-1 accepts or receives the first signal 304-1 from an "upstream" component. The first port 132-1 provides the first signal 304-1 to the first current balun 134-1 of the first coupling circuitry 302-1. The first current balun 134-1 converts the single-ended first signal 304-1 into a differential signal, which may have a first signal component and a second signal component (e.g., as shown in FIG. 6 and described further with reference to FIG. 8). The first coupling circuitry 302-1 forwards the first and second signal components to the filter core 136.

The filter core 136 filters the first and second signal components to produce first and second filtered signal components, which are provided to the second coupling circuitry 302-2. The second current balun 134-2 converts the first and second filtered signal components in a differential form to the second signal 304-2, which is filtered and has a single-ended form. Accordingly, the second signal 304-2 can be or can include a filtered version of the first signal 304-1. The second coupling circuitry 302-2 couples the filtered second signal 304-2 to the second port 132-2. The second port 132-2 can forward or transmit the second signal 304-2 from the filter circuit 130 to a downstream component.

Alternatively, a filter circuit 130 may accept a second signal 304-2 via the second port 132-2 and forward a first signal 304-1 from the first port 132-1 as a filtered version of the second signal 304-2. Further, although the filter circuit 130 is depicted in FIG. 3 with unidirectional signal flows, at least some described filter circuit implementations can be bidirectional. For example, in one direction of a given filter circuit 130, a first port 132-1 can receive a first signal, and a second port 132-2 can transmit a second signal, with the second signal being based on filtering the first signal. In another direction of the same filter circuit 130 (e.g., at a different time or for a different mode), the second port 132-2 can receive a signal, and the first port 132-1 can transmit another signal based on a filtering by the filter core 136 of the received signal.

Figure 4:
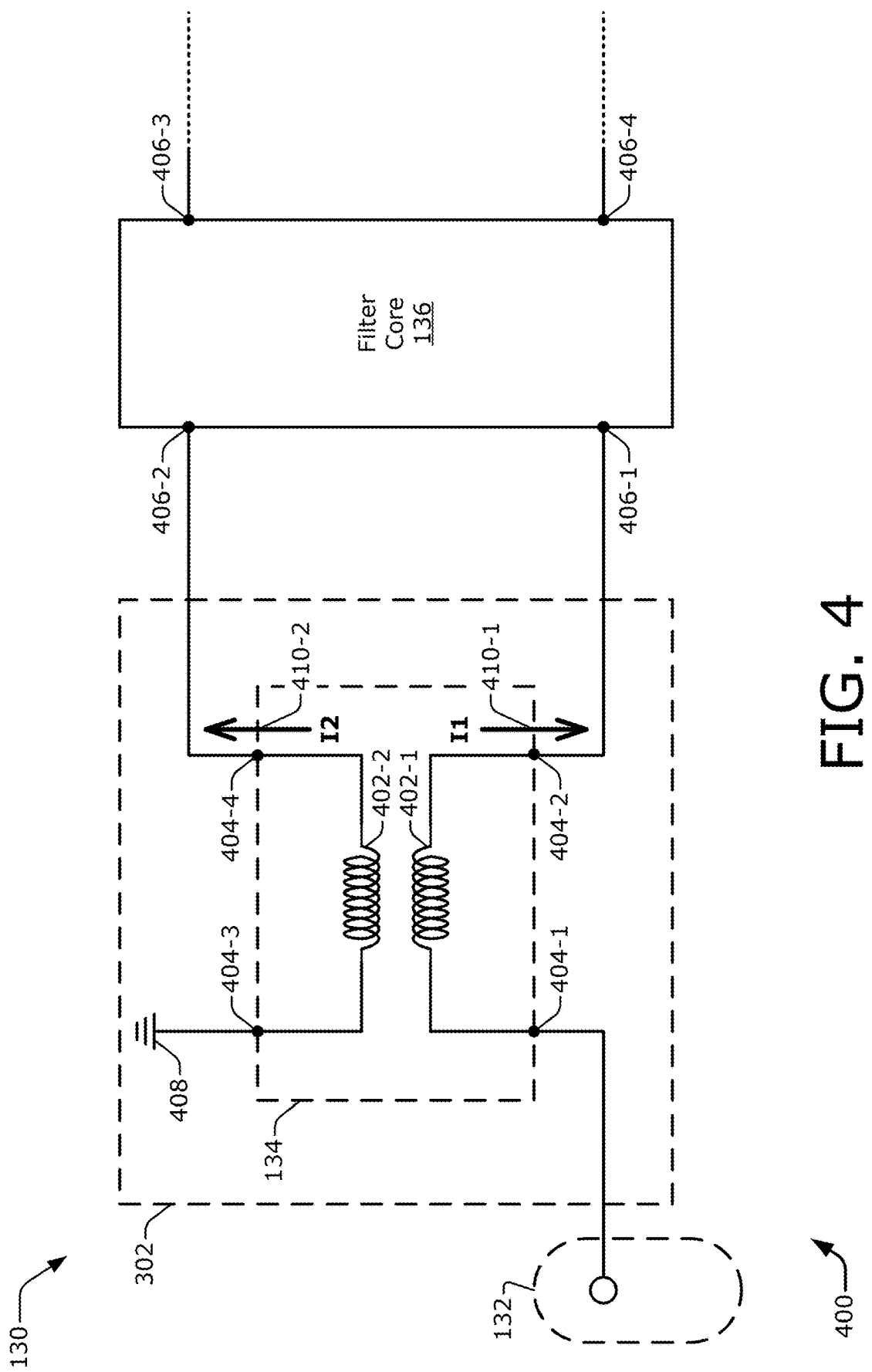
FIG. 4 is a circuit diagram illustrating a filter circuit including coupling circuitry having an example current balun.

FIG. 4 is a circuit diagram 400 illustrating a filter circuit 130 including coupling circuitry 302 having an example current balun 134. As shown, the current balun 134 includes at least two inductors: a first inductor 402-1 and a second inductor 402-2. The current balun 134 also includes four terminals: a first terminal 404-1, a second terminal 404-2, a third terminal 404-3, and a fourth terminal 404-4. The filter core 136 includes at least four terminals: a first terminal 406-1, a second terminal 406-2, a third terminal 406-3, and a fourth terminal 406-4. Although a single port 132, a single coupling circuitry 302, and a single current balun 134 are explicitly depicted in FIG. 4, the filter circuit 130 may include symmetrical instantiations of such components on the "other side" of the filter core 136 (e.g., to the right of the filter core 136 as drawn).

In example implementations, the first terminal 404-1 of the current balun 134 is coupled to the port 132, and the third terminal 404-3 of the current balun 134 is coupled to a ground 408. The first inductor 402-1 is galvanically coupled between the first terminal 404-1 and the second terminal 404-2 of the current balun 134. The second inductor 402-2 is galvanically coupled between the third terminal 404-3 and the fourth terminal 404-4 of the current balun 134.

The filter core 136 is coupled between the current balun 134 and another port 132 (e.g., as shown in FIGS. 3 and 6). The filter core 136 is coupled to the second terminal 404-2 of the current balun 134 and the fourth terminal 404-4 of the current balun 134. More specifically, the first terminal 406-1 of the filter core 136 is coupled to the second terminal 404-2 of the current balun 134, and the second terminal 406-2 of the filter core 136 is coupled to the fourth terminal 404-4 of the current balun 134. As used herein, a "terminal" can include or otherwise correspond to a node, such as a node that is associated with a particular component for ingress or egress of a signal with respect to that component.

Each inductor 402 can be implemented or realized in any of many different manners. For example, an inductor 402 can be implemented with a coil, a wire-wound inductive element, a spiral inductive element, a conductive trace, a length of line (e.g., a transmission line), a microstrip, a stripline, a combination thereof, and so forth. If two inductors of the current balun 134 are realized with two coupled lines, the two inductors can be edge-coupled or broadside-coupled transmission lines. To form a current balun 134, the first inductor 402-1 is positioned sufficiently close to the second inductor 402-2 to electromagnetically couple the two inductors. In some cases, the first inductor 402-1 can be fabricated in one metal layer, and the second inductor 402-2 can be fabricated in another layer. At least one nonconductive layer can be disposed (e.g., "sandwiched") between the two metal layers. At least a portion of each of the two inductors 402-1 and 402-2 may be positioned "above" or "below" one another to produce the electromagnetic coupling.

As used herein, a "galvanic" coupling can involve physical contact along an electrical path. A "galvanic" coupling refers to an electrical coupling that need not rely on an electromagnetic coupling for signal communication. For example, a galvanic coupling can produce an ohmic or resistive effect between two nodes, e.g., in response to even a direct-current (DC) current. Thus, there is galvanic coupling between the first terminal 404-1 and the second terminal 404-2 of the current balun 134 across the first inductor 402-1. In contrast, there can be an electromagnetic coupling between the first terminal 404-1 and the fourth terminal 404-4 of the current balun 134 via the first inductor 402-1 and the second inductor 402-2. There is not, however, a galvanic coupling between the first terminal 404-1 and the fourth terminal 404-4 of the current balun 134, at least relative to the components and wiring of the current balun 134—e.g., there is no galvanic coupling between the first terminal 404-1 and the fourth terminal 404-4 within the current balun 134. An inductor that is galvanically coupled between two terminals (e.g., between the first terminal 404-1 and the second terminal 404-2 of the current balun 134) or between two components (e.g., between the port 132 and the filter core 136) can be capable of carrying a DC current between the two terminals or the two components, even if a current between the two terminals or components is typically an alternating-current (AC) current during filtering operations of the filter circuit 130.

For some filters with a voltage balun (not shown) that has two inductors, a filter core is galvanically coupled to a single inductor of the two inductors of the voltage balun. If the coupling circuitry 302 of FIG. 4 were to have a voltage balun, then the first and second terminals 406-1 and 406-2 of the filter core 136 would be galvanically coupled together via that single inductor (e.g., which acts as a DC current short). In such cases, the filter core may be electromagnetically coupled to the other inductor of the two inductors of the voltage balun via the single inductor.

As shown in FIG. 4, on the other hand, the filter core 136 is galvanically coupled to two inductors: the first inductor 402-1 and the second inductor 402-2. The filter core 136 is galvanically coupled to the first inductor 402-1 via the second terminal 404-2 of the current balun 134 and the first terminal 406-1 of the filter core 136. The filter core 136 is also galvanically coupled to the second inductor 402-2 via the fourth terminal 404-4 of the current balun 134 and the second terminal 406-2 of the filter core 136. There is therefore a galvanic coupling and/or a galvanic path between the port 132 and the first terminal 406-1 of the filter core 136. This galvanic coupling extends through the first inductor 402-1 via the first terminal 404-1 and the second terminal 404-2 of the current balun 134. The coupling between the first terminal 406-1 and the second terminal 406-2 of the filter core 136, at least with respect to the coupling circuitry 302, is an electromagnetic coupling via the first and second inductors 402-1 and 402-2 of the current balun 134 (e.g., which is open from a DC current perspective).

In example operations, the current balun 134 enables the filter circuit 130 to provide a wider bandwidth as compared to using a voltage balun in place of the current balun 134. The current balun 134 can cause the currents on the two balanced lines to be approximately equal. For example, a first current 410-1 (I1) and a second current 410-2 (I2) can be approximately equal. These approximately equal first and second currents 410-1 and 410-2 substantially contribute to the reduction of nonlinear effects in the filter circuit 130. As used herein, two signals (e.g., two magnitudes of a signal at different times or two magnitudes of two signals at a same time) or two signal components can be approximately equal if such signals (e.g., if the magnitudes thereof) are within 10% of each other (e.g., within 5%, within 3%, or even within 1% of one another). Thus, the current balun 134 can substantially balance a first current 410-1 flowing through the second terminal 404-2 of the current balun 134 with a second current 410-2 flowing through the fourth terminal 404-4 of the current balun 134.

Figure 5:
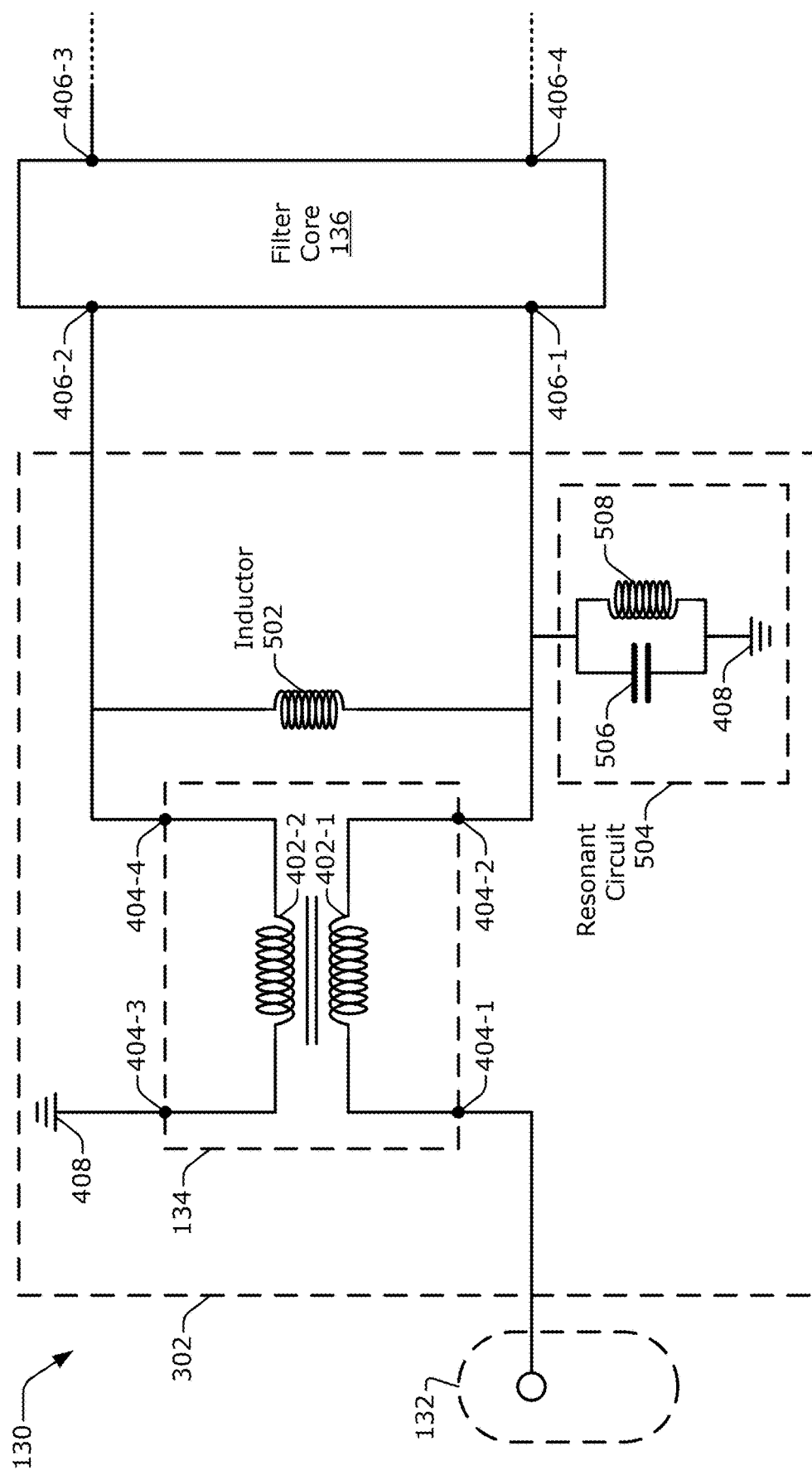
FIG. 5 is a circuit diagram illustrating a filter circuit including coupling circuitry having example components coupled to a current balun.
Figures 1, 5:
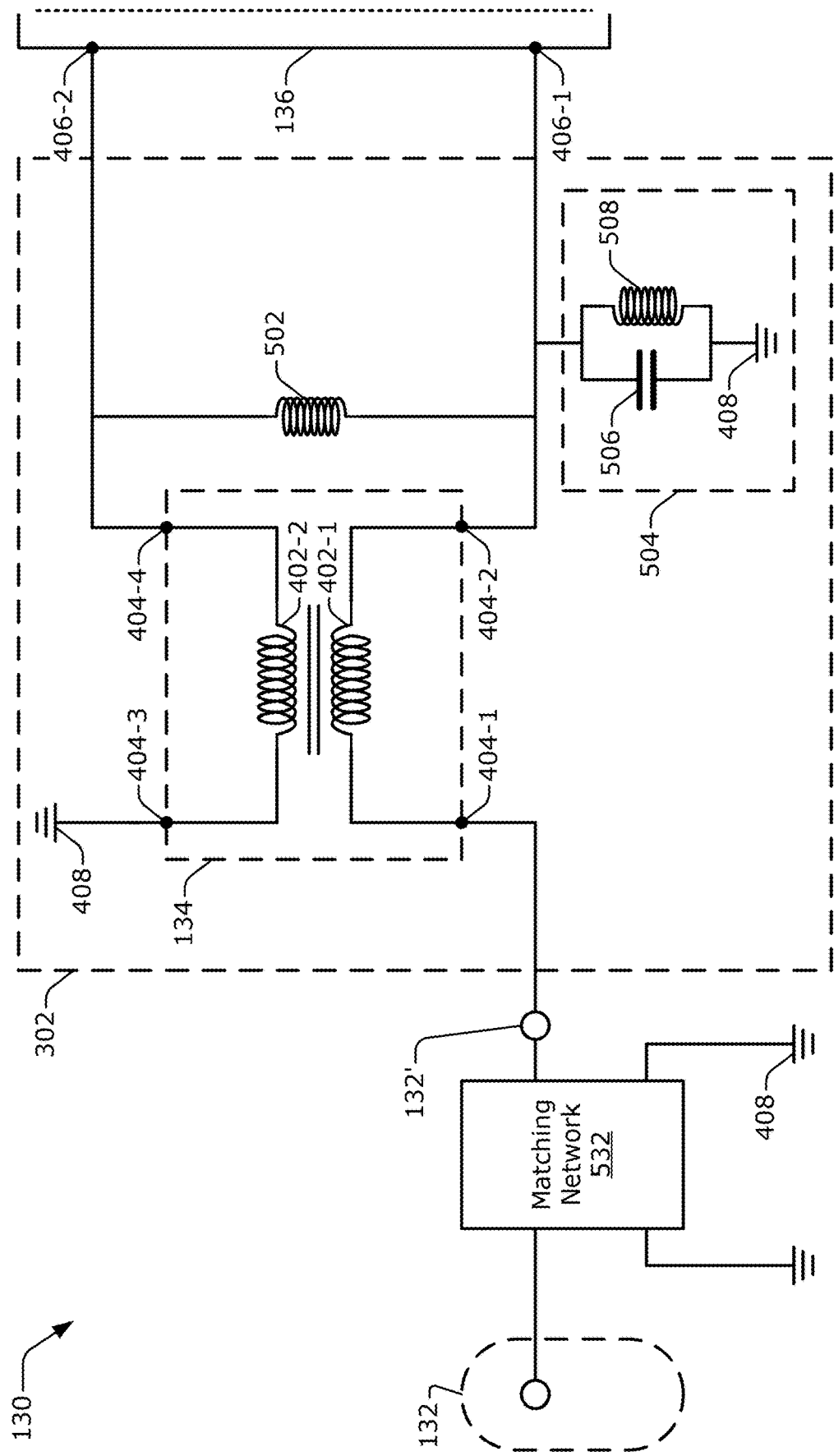
Figure 6:
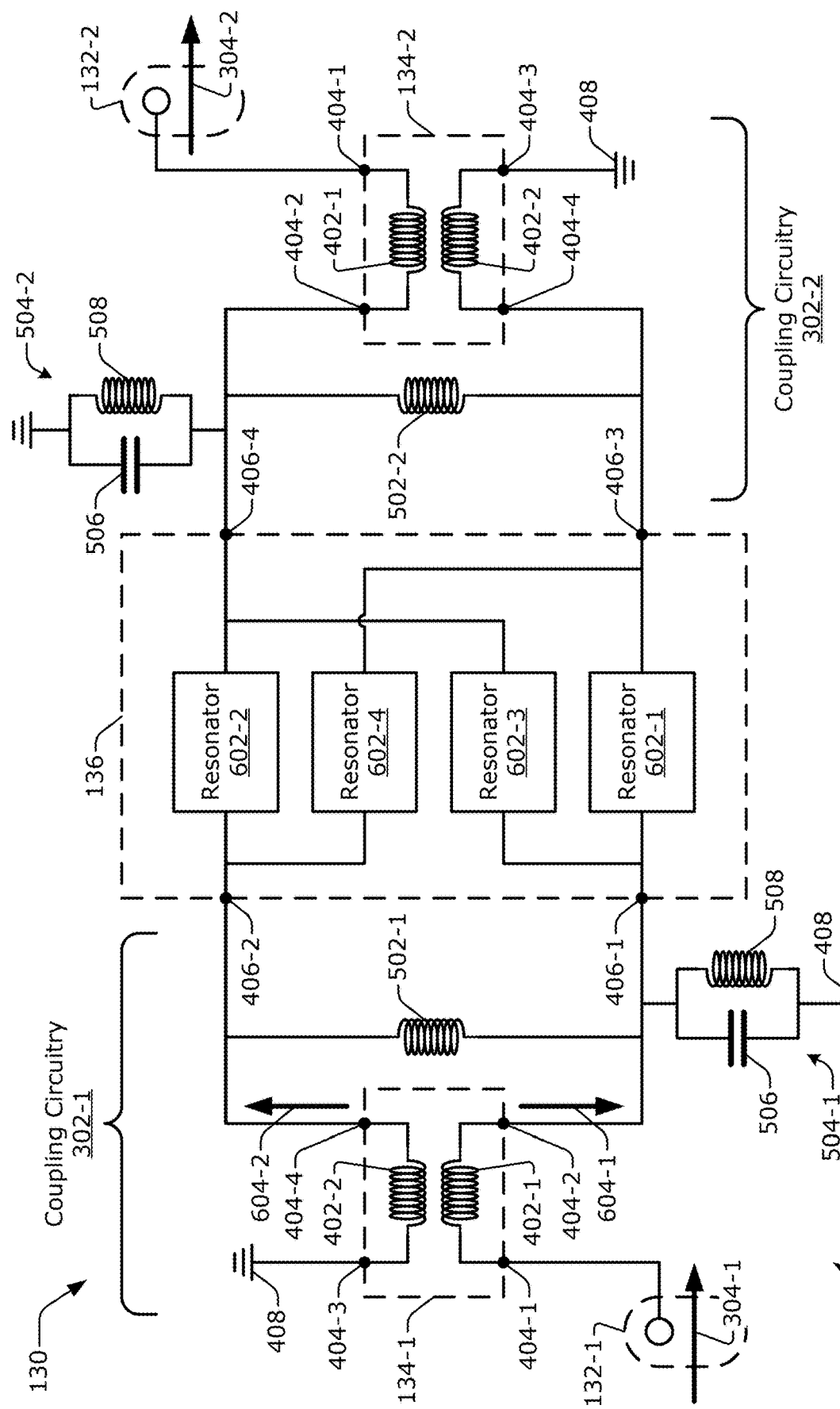
FIG. 6 is a circuit diagram illustrating an example filter circuit including a filter core with a lattice-filter architecture including at least one resonator.

FIG. 5 is a circuit diagram 500 illustrating a filter circuit 130 including coupling circuitry 302 having example components coupled to a current balun 134. The circuit diagram 500 depicts various additional or alternative implementations that may be separately or jointly included in the implementations that are illustrated in the drawings or described herein. For example, the current balun 134 is illustrated as having a core, such as a magnetic core, based on the depiction of the two parallel lines.

In some example implementations, an inductor 502 is coupled in parallel with the current balun 134 and/or with the filter core 136. The inductor 502 is coupled between respective terminals of the first inductor 402-1 and the second inductor 402-2. As shown, the inductor 502 is coupled between the second terminal 404-2 of the current balun 134 and the fourth terminal 404-4 of the current balun 134. The inductor 502 can also be coupled between two balanced lines of the differential section of the filter circuit 130. As shown, the inductor 502 is coupled between the first terminal 406-1 of the filter core 136 and the second terminal 406-2 of the filter core 136.

In example operations, the inductor 502 can at least partially compensate for errors introduced, or that would otherwise be introduced, into the filtering operation by the non-ideal components of a physical current balun 134. For instance, two coupled transmission lines that realize the first and second inductors 402-1 and 402-2 of the current balun 134 may cause phase and/or magnitude errors in a signal propagating through the filter circuit 130 absent the parallel inductor 502 due to imperfect electromagnetic coupling. The parallel inductor 502, however, can reduce these errors by being coupled between the balanced terminals of the current balun 134. The inductor 502 can also contribute to establishing a desired bandwidth of the filter circuit 130. An inductance value of the inductor 502 can be based on multiple factors. Such factors may include a filter degree, a relative bandwidth, a center frequency, a number of or positions of additional finite transmission zeros (FTZs) that are placed, and so forth.

In other example implementations, a resonant circuit 504 is coupled to at least one terminal 404 of the current balun 134. As shown, the resonant circuit 504 is coupled in parallel with the current balun 134 and/or the filter core 136. The resonant circuit 504 is coupled between a terminal 404 (e.g., the second terminal 404-2) of the current balun 134 and the ground 408. Thus, the resonant circuit 504 can operate as a parallel resonant circuit or a shunt resonant circuit.

In some cases, the resonant circuit 504 includes at least one inductor and at least one capacitor as shown. A capacitor 506 and an inductor 508 are coupled together in parallel between the second terminal 404-2 and the ground 408. In other cases, the resonant circuit 504 can include fewer, more, and/or different components. For example, the resonant circuit 504 can be formed from at least one transmission line, such as a microstrip or stripline. The resonant circuit 504 can be realized using, for instance, a one-quarter wavelength transmission line, with the wavelength being relative to a center frequency of the filter circuit 130. A shorted quarter-wave stub, however, may introduce transmission-line-based harmonic responses that are present in the filter transfer function, which can deteriorate the filter performance relative to the inductive-capacitive component implementation.

In example operations, inclusion of the resonant circuit 504 can appreciably increase the bandwidth of the current balun 134 relative to omitting the resonant circuit 504. The resonant frequency of the resonant circuit 504 can be configured to be above the passband of a bridge-type filter of the filter core 136. As shown in FIG. 5, the parallel resonant circuit 504 is coupled to the second terminal 404-2 of the current balun 134. Generally, the resonant circuit 504 is coupled to a terminal of the two terminals of the current balun 134 that are proximate to the filter core 136 and relatively distant from the port 132 (on a given side of the filter core 136). Of these two terminals, the resonant circuit 504 can be coupled to the terminal that is galvanically coupled to the port 132, which is the second terminal 404-2 via the first inductor 402-1 and the first terminal 404-1 in the example filter circuit 130 of FIG. 5.

FIG. 5-1 is a circuit diagram 500-1 illustrating a filter circuit 130 including an example matching network 532 coupled between a port 132 and coupling circuitry 302 that has a current balun 134. Certain components are depicted in the various illustrated circuits of the drawings. Nonetheless, more, fewer, different, and/or other components may be included in any given circuit. For example, in the circuit diagram 500-1, the port 132 is coupled to the current balun 134 of the coupling circuitry 302. A matching network 532 is coupled between the port 132 and the current balun 134.

The matching network 532, if present, can facilitate an impedance matching between different parts of a larger circuit, such as between the coupling circuitry 302 and an upstream or downstream component on the other side of the port 132. In alternative implementations, the matching network 532, if present, may be located external to the filter circuit 130 as indicated by the alternatively-located port 132', which is electrically positioned between the matching network 532 and the coupling circuitry 302.

FIG. 6 is a circuit diagram 600 illustrating an example filter circuit 130 including a filter core 136 with an example lattice-filter architecture including at least one resonator 602. As shown, the filter core 136 can include one or more resonators, such as four resonators. These four resonators may include a first resonator 602-1, a second resonator 602-2, a third resonator 602-3, and a fourth resonator 602-4. A first current balun 134-1 can include a first inductor 402-1 and a second inductor 402-2. Likewise, a second current balun 134-2 can include a first inductor 402-1 and a second inductor 402-2. A first signal component 604-1 and a second signal component 604-2 are described below with reference to FIG. 8.

In example implementations, the filter circuit 130 includes the first current balun 134-1 coupled to the filter core 136. The first current balun 134-1 includes a first terminal 404-1 coupled to a first port 132-1 of the filter circuit 130, a second terminal 404-2, a third terminal 404-3, and a fourth terminal 404-4. The first current balun 134-1 also includes a first inductor 402-1 and a second inductor 402-2. The first inductor 402-1 is galvanically coupled between the first terminal 404-1 and the second terminal 404-2. The second inductor 402-2 is galvanically coupled between the third terminal 404-3 and the fourth terminal 404-4. The filter core 136 is coupled between the first current balun 134-1 and a second port 132-2 of the filter circuit 130. The filter core 136 is galvanically coupled to the second terminal 404-2 of the first current balun 134-1 and to the fourth terminal 404-4 of the first current balun 134-1. The third terminal 404-3 of the first current balun 134-1 may be coupled to a ground 408.

In some cases, the filter circuit 130 includes a resonant circuit 504 (e.g., a first resonant circuit 504-1) coupled between the second terminal 404-2 of the first current balun 134-1 and the ground 408. The filter circuit 130 may also or instead include another resonant circuit (e.g., a second resonant circuit 504-2) coupled between the second terminal 404-2 of the second current balun 134-2 and the ground 408. Generally, the resonant circuit 504 can include an inductor 508 and a capacitor 506 that is coupled in parallel with the inductor 508 between the second terminal 404-2 of the current balun 134 (e.g., the first or second current balun 134-1 or 134-2) and the ground 408.

Additionally or alternatively, the first or second resonant circuit 504-1 or 504-2 may include a transmission line (not shown) that is coupled between the second terminal 404-2 of the first or second current balun 134-1 or 134-2, respectively, and the ground 408. The filter circuit 130 can also include an inductor 502 coupled between the second terminal 404-2 of the current balun 134 and the fourth terminal 404-4 of the current balun 134. On the left side of FIG. 6 (as depicted), an inductor 502-1 is coupled between the second terminal 404-2 of the first current balun 134-1 and the fourth terminal 404-4 of the first current balun 134-1. On the right side of FIG. 6 (as depicted), another inductor 502-2 is coupled between the second terminal 404-2 of the second current balun 134-2 and the fourth terminal 404-4 of the second current balun 134-2.

In some implementations, the first resonator 602-1 is coupled between the second terminal 404-2 of the first current balun 134-1 and a first node, such as a third terminal 406-3 of the filter core 136. The second resonator 602-2 is coupled between the fourth terminal 404-4 of the first current balun 134-1 and a second node, such as fourth terminal 406-4 of the filter core 136. The third resonator 602-3 is coupled between the second terminal 404-2 of the first current balun 134-1 and the second node. The fourth resonator 602-4 is coupled between the fourth terminal 404-4 of the first current balun 134-1 and the first node.

Figures 1, 7:
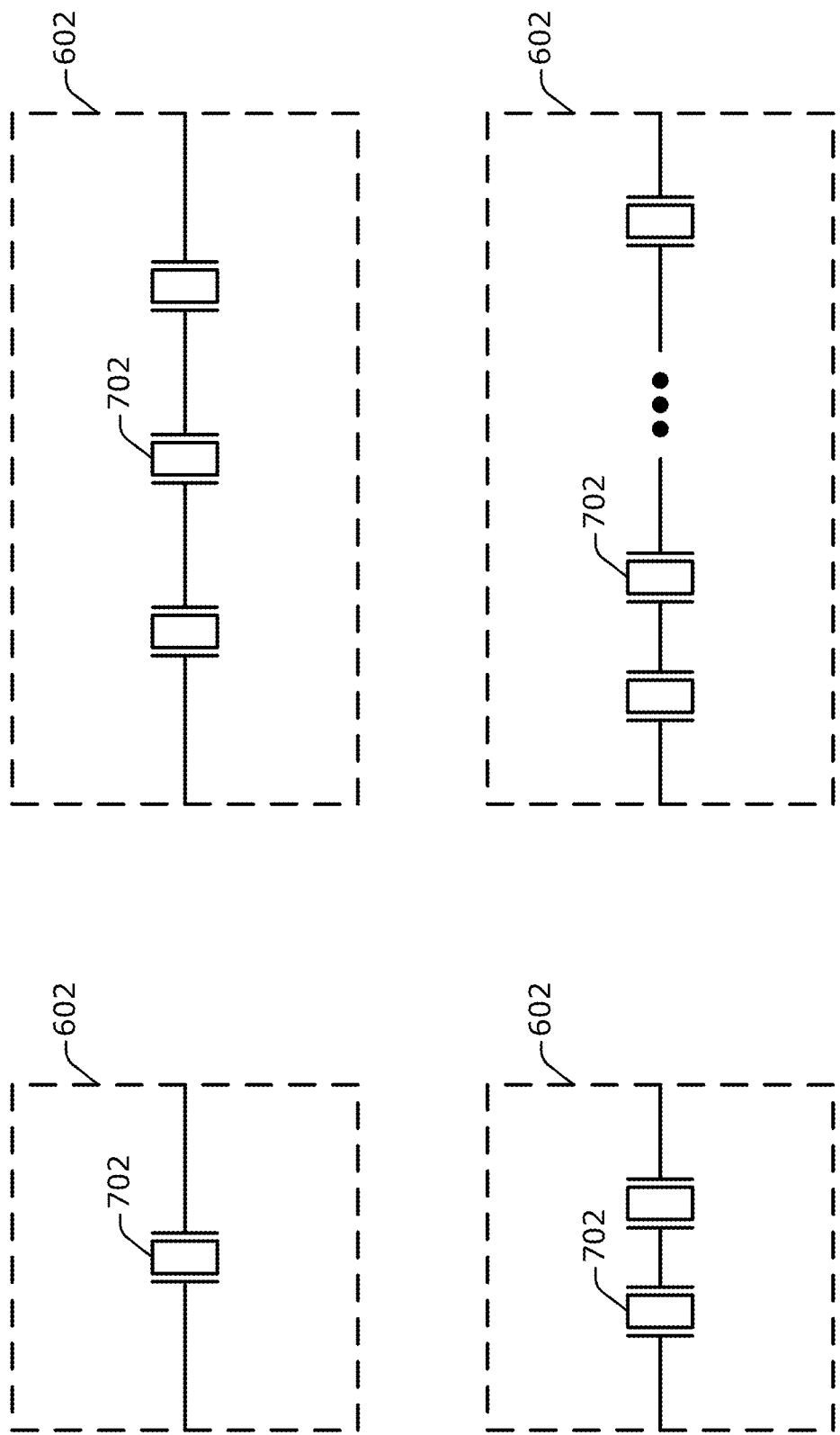
Figures 2, 7:
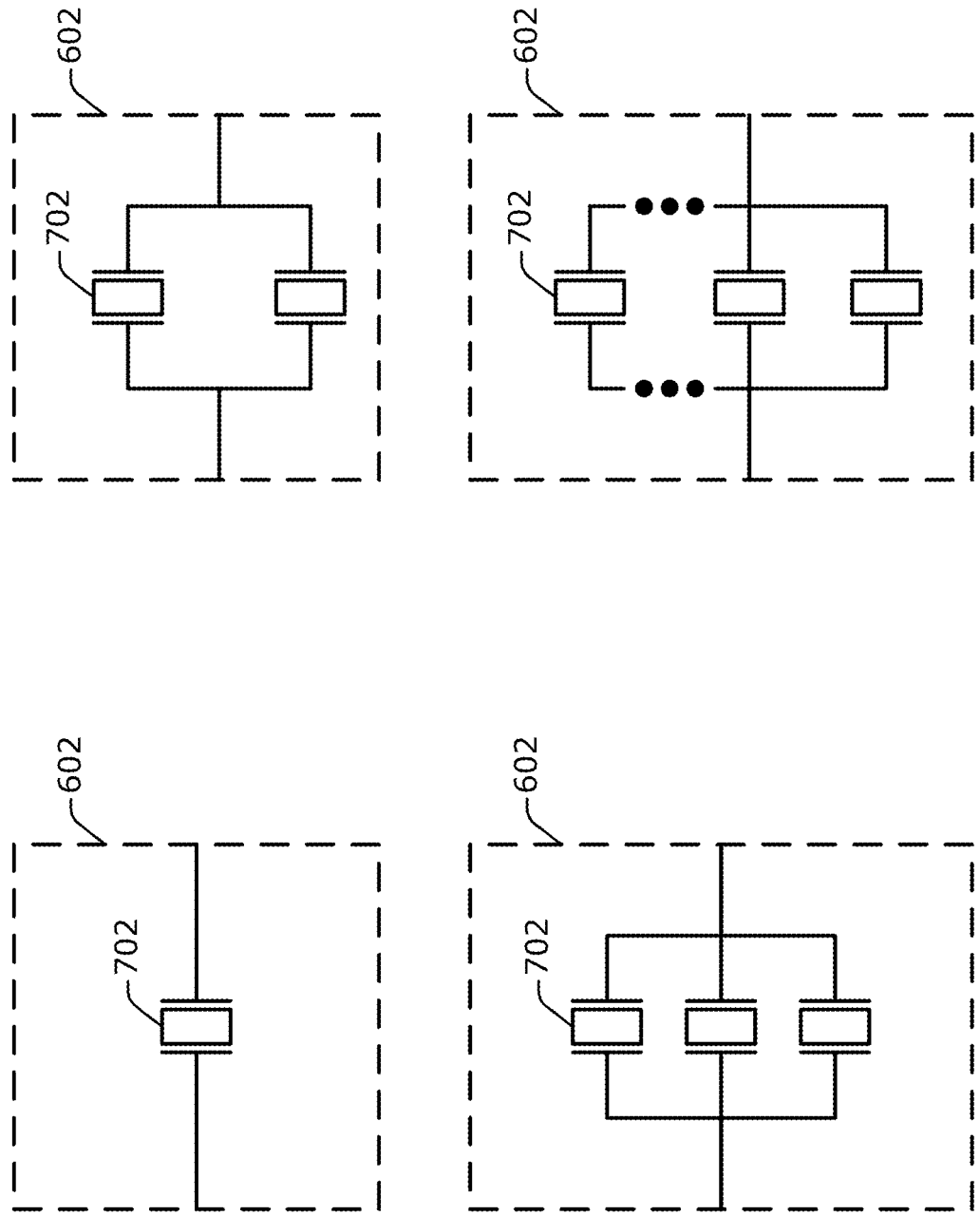
Figures 3, 7:
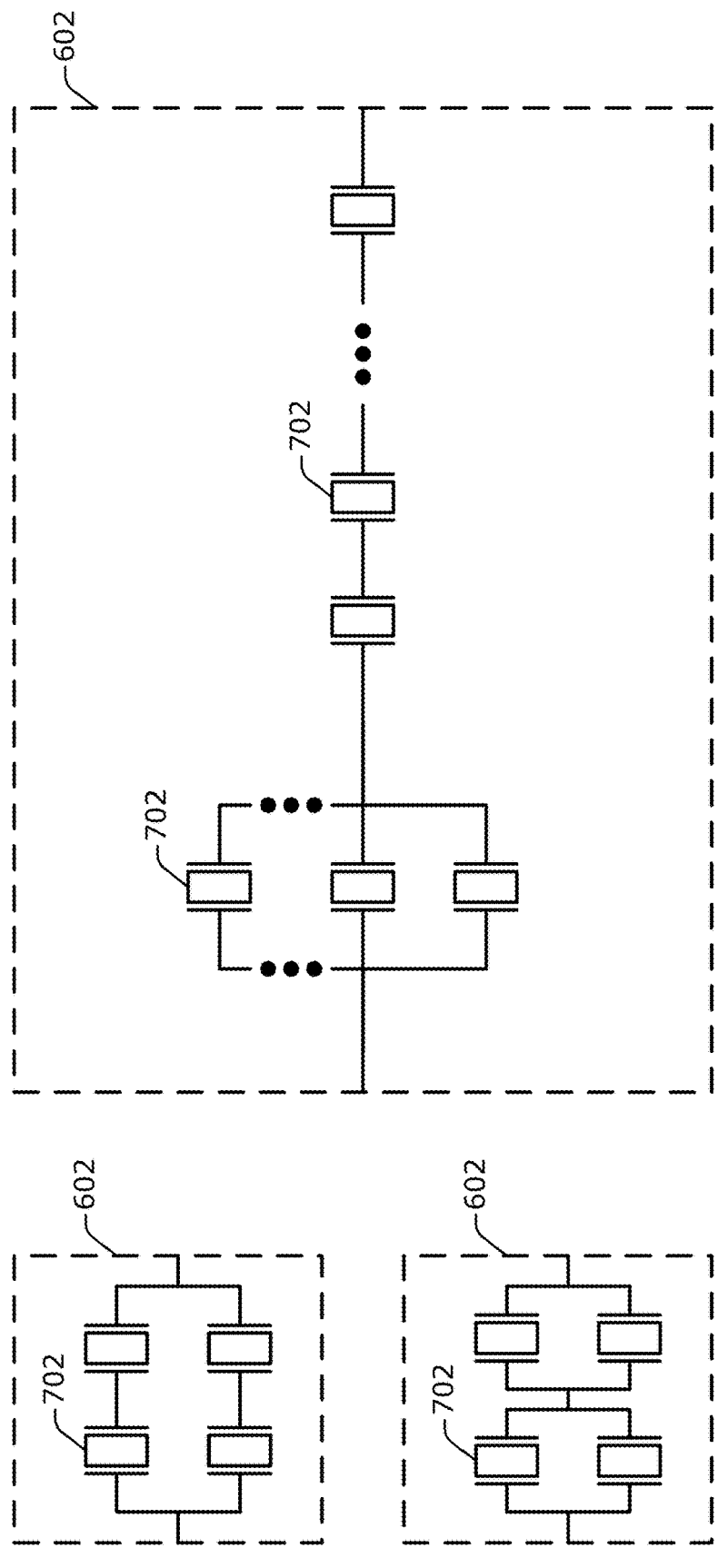

In some cases, each resonator 602 can include at least one acoustic wave resonator 702 (e.g., of FIGS. 7-1 to 7-3). Thus, each resonator 602, such as the first resonator 602-1, can include multiple acoustic wave resonators that are coupled together in series. Additionally or alternatively, each resonator 602 can include multiple acoustic wave resonators that are coupled together in parallel. Examples of acoustic wave resonator arrangements are described below with reference to FIGS. 7-1 to 7-3.

The filter core 136 can be realized with any of many different filter architectures. An example of a suitable filter architecture for the filter core 136 is a bridge filter, and an example of a bridge filter is a lattice filter. As shown, four resonators 602-1 to 602-4 of the filter core 136 are coupled between the two current baluns 134-1 and 134-2. The depicted configuration of the filter core 136 is an example lattice-type filter architecture. There are two "straight" paths with each path having a resonator 602-1 or 602-2 and two "cross-coupled" paths with each path having a resonator 602-3 or 602-4. The two "cross-coupled" paths form an "X-shaped" architecture of the lattice-type filter of the filter core 136.

Pairs of resonators may be substantially identical to each other. For example, the first and second resonators 602-1 and 602-2 along the straight paths may be substantially identical to one another. Similarly, the third and fourth resonators 602-3 and 602-4 along the cross-coupled paths may be substantially identical to one another. If the multiple resonators 602-1 to 602-4 are implemented as acoustic resonators, the substantially identical pairs may have substantially equal impedance and/or resonant frequency values. Here, "substantially identical" or "substantially equal" can refer to two components that are architected to be the same (with possible fabrication variances) and/or can refer to those components having physical structures and/or circuit values that are within 10% of each other (e.g., within 5%, within 3%, or even within 1% of one another).

Each respective "straight" path is coupled between two non-corresponding respective terminals of the first and second current baluns 134-1 and 134-2. These two non-corresponding respective terminals are shown as upper terminal to upper terminal (as depicted on the drawing sheet) and vice versa. More specifically, each straight path is coupled between two respective inductors that are coupled to two different respective things. For example, the first resonator 602-1 is coupled between the first inductor 402-1 of the first current balun 134-1 (via the second terminal 404-2 thereof) and the second inductor 402-2 of the second current balun 134-2 (via the fourth terminal 404-4 thereof). The first inductor 402-1 of the first current balun 134-1 is coupled to a port 132, but the second inductor 402-2 of the second current balun 134-2 is coupled to a ground.

Each respective "cross-coupled" path is coupled between two corresponding respective terminals of the first and second current baluns 134-1 and 134-2. These two corresponding respective terminals are shown as upper terminal to lower terminal (as depicted on the drawing sheet) and vice versa. More specifically, each cross-coupled path is coupled between two respective inductors that are coupled to the same two respective kinds of things. For example, the third resonator 602-3 is coupled between the first inductor 402-1 of the first current balun 134-1 (via the second terminal 404-2 thereof) and the first inductor 402-1 of the second current balun 134-2 (via the second terminal 404-2 thereof). The first inductor 402-1 of the first current balun 134-1 is coupled to a port 132 (e.g., the first port 132-1), and the first inductor 402-1 of the second current balun 134-2 is coupled to another port (e.g., the second port 132-2). Although a specific lattice-type filter is shown in FIG. 6, the techniques for using a current balun with an RF filter can be applied to other filter architectures.

With regard to the second current balun 134-2, the second current balun 134-2 includes a first terminal 404-1 coupled to the second port 132-2, a second terminal 404-2, a third terminal 404-3 coupled to the ground 408, and a fourth terminal 404-4. The first inductor 402-1 of the second current balun 134-2 is galvanically coupled between the first terminal 404-1 of the second current balun 134-2 and the second terminal 404-2 of the second current balun 134-2. The second inductor 402-2 of the second current balun 134-2 is galvanically coupled between the third terminal 404-3 of the second current balun 134-2 and the fourth terminal 404-4 of the second current balun 134-2. Further, the second terminal 404-2 of the second current balun 134-2 is coupled to (and may correspond to) the second node (e.g., the fourth terminal 406-4 of the filter core 136). The fourth terminal 404-4 of the second current balun 134-2 is coupled to (and may correspond to) the first node (e.g., the third terminal 406-3 of the filter core 136).

To reduce signal errors that may result from the non-ideal components of the first and second current baluns 134-1 and 134-2, the filter circuit 130 may include at least one additional inductor 502. For example, an inductor 502-1 can be coupled between the second terminal 404-2 of the first current balun 134-1 and the fourth terminal 404-4 of the first current balun 134-1. Another inductor 502-2 can be coupled between the second terminal 404-2 of the second current balun 134-2 and the fourth terminal 404-4 of the second current balun 134-2. The two inductors 502-1 and 502-2 can also contribute to setting the bandwidth of the filter circuit 130 in conjunction with the acoustic core that is formed by the multiple acoustic resonators. For example, an inductor 502 can increase the bandwidth of the filter circuit 130.

To expand the bandwidth provided by each current balun 134, each "side" of the filter circuit 130 can include a resonant circuit 504, such as an inductive-capacitive circuit with at least one inductor and at least one capacitor. As shown, by way of example only, a first resonant circuit 504-1 (e.g., an inductive-capacitive circuit) is coupled between the second terminal 404-2 of the first current balun 134-1 and the ground 408. Similarly, a second resonant circuit 504-2 (e.g., another inductive-capacitive circuit) is coupled between the second terminal 404-2 of the second current balun 134-2 and the ground 408.

FIGS. 7-1 to 7-3 are circuit diagrams 700-1 to 700-3 of example resonators that each include at least one acoustic wave resonator 702. Each resonator 602 (also of FIG. 6) is part of the filter core 136 of a filter circuit 130 (e.g., of FIG. 6). Each resonator 602 can be realized with one or more acoustic wave resonators and/or with an acoustic wave resonator arrangement. Each acoustic wave resonator 702 can be implemented with a bulk acoustic wave (BAW) resonator, a surface acoustic wave (SAW) resonator, and so forth. Generally, each resonator 602 can be implemented with multiple acoustic wave resonators that are coupled together in series, in parallel, or in a combination of series and parallel connections.

FIG. 7-1 depicts at the circuit diagram 700-1 examples of acoustic wave resonators coupled together in series. At the upper-left of the drawing sheet, the resonator 602 is implemented with a single acoustic wave resonator 702. At the lower-left, the resonator 602 is implemented with two acoustic wave resonators coupled together in series. At the upper-right of the drawing sheet, the resonator 602 is implemented with three acoustic wave resonators coupled together in series. At the lower-right, the resonator 602 is implemented with "N" acoustic wave resonators connected together in series, with "N" representing a positive integer.

FIG. 7-2 depicts at the circuit diagram 700-2 examples of acoustic wave resonators coupled together in parallel. At the upper-left of the drawing sheet, the resonator 602 is implemented with a single acoustic wave resonator 702. At the upper-right, the resonator 602 is implemented with two acoustic wave resonators coupled together in parallel. At the lower-left of the drawing sheet, the resonator 602 is implemented with three acoustic wave resonators coupled together in parallel. At the lower-right, the resonator 602 is implemented with "N" acoustic wave resonators connected together in parallel, with "N" representing a positive integer.

FIG. 7-3 depicts at the circuit diagram 700-3 examples of acoustic wave resonators coupled together in a combination of series connections and parallel connections. At the upper-left of the drawing sheet, the resonator 602 is implemented with four acoustic wave resonators. Two series-coupled pairs of acoustic wave resonators are coupled together in parallel. At the lower-left, the resonator 602 is also implemented with four acoustic wave resonators, but two parallel-coupled pairs of acoustic wave resonators are then coupled together into a series connection. At the right side of the drawing sheet, the resonator 602 is implemented with "N" acoustic wave resonators coupled together in both series and parallel configurations, with "N" representing a positive integer.

Any quantity of acoustic wave resonators can be coupled together in series or in parallel, and any quantity of series or parallel-connected sets of acoustic wave resonators can be further coupled together in series or parallel and/or nested in any manner. Individual acoustic wave resonators of series-connected or parallel-connected acoustic wave resonators may have, or may not have, substantially equal characteristics (e.g., impedance and/or resonant frequency). If the multiple series-connected or parallel-connected acoustic resonators are different from each other so as not to have substantially equal characteristics, the filter order is increased. The higher filter order can increase selectivity. On the other hand, if the multiple series-connected or parallel-connected acoustic resonators are substantially equal to each other, the filter order remains unchanged, but the performance can be improved in terms, e.g., of power handling or linearity.

Figure 8:
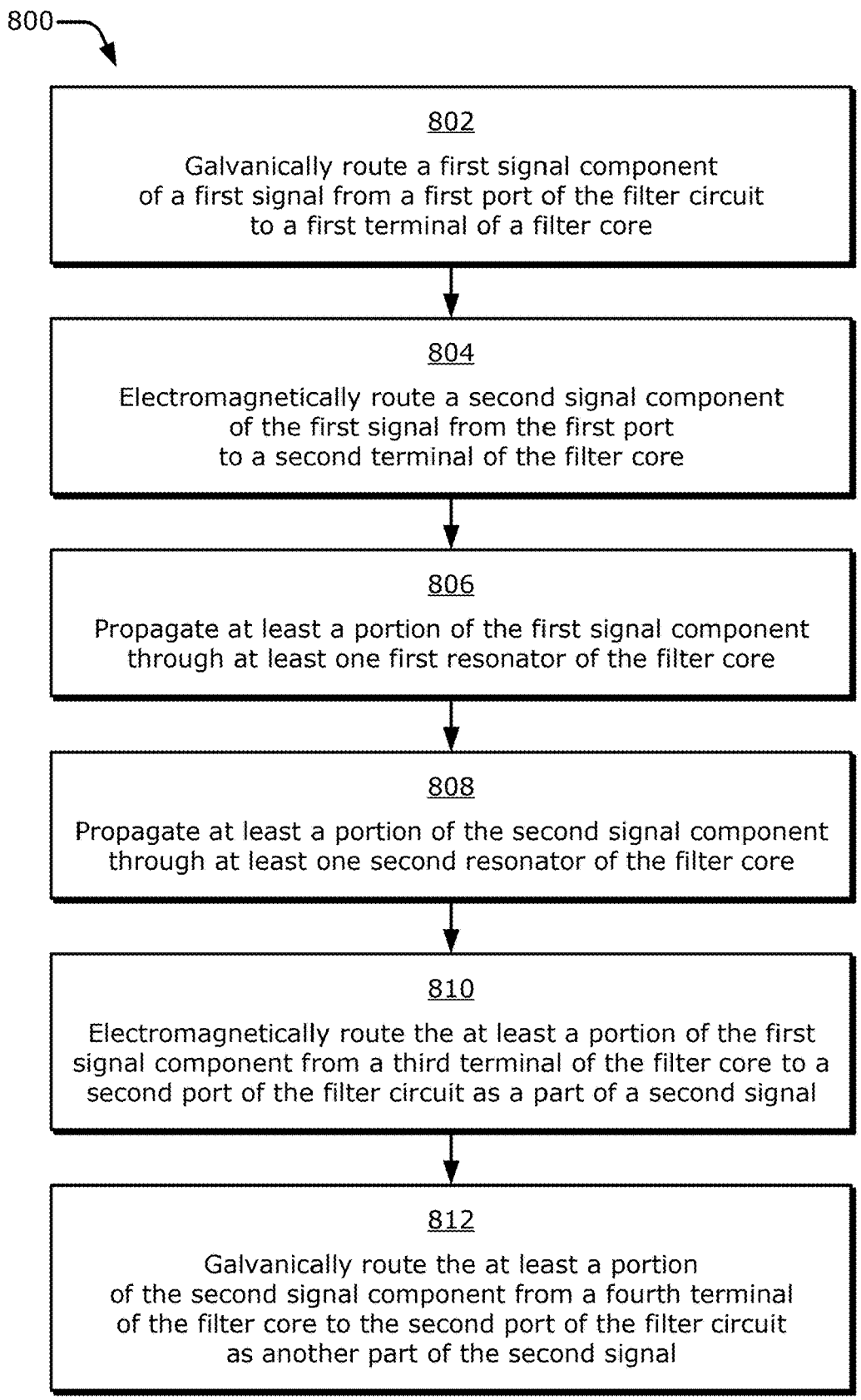
FIG. 8 is a flow diagram illustrating an example process for filtering signals and/or for operating a filter circuit as described herein.

FIG. 8 is a flow diagram illustrating an example process 800 for filtering signals and/or for operating a filter circuit as described herein. The process is described in the form of a set of blocks that specify operations that can be performed. However, operations are not necessarily limited to the order shown in the figure or described herein, for the operations may be implemented in alternative orders or in fully or partially overlapping manners. Also, more, fewer, and/or different operations may be implemented to perform a respective process or an alternative process. Operations represented by the illustrated blocks of each process may be performed by an electronic device, such as the electronic device 102 of FIG. 1 or the wireless interface device 120 thereof. More specifically, the operations of the respective processes may be performed by a filter circuit 130 of a transceiver 126 or an RF front-end 128, independently or in conjunction with other components.

The process 800 includes six blocks 802-812 that specify operations that can be performed for a method. At block 802, a first signal component of a first signal is galvanically routed from a first port of a filter circuit to a first terminal of a filter core. For example, a filter circuit 130 can galvanically route a first signal component 604-1 of a first signal 304-1 from a first port 132-1 of the filter circuit 130 to a first terminal 406-1 of a filter core 136. A first current balun 134-1 may convert the first signal 304-1 having a single-ended form into a differential form including at least the first signal component 604-1 and a second signal component 604-2. A first inductor 402-1 of the first current balun 134-1 may propagate the first signal component 604-1 toward and/or from the second terminal 404-2 of the first current balun 134-1, which first signal component 604-1 then continues onward to the first core 136 over one or more wires or signal traces.

At block 804, a second signal component of the first signal is electromagnetically routed from the first port to a second terminal of the filter core. For example, the filter circuit 130 can electromagnetically route the second signal component 604-2 of the first signal 304-1 from the first port 132-1 to a second terminal 406-2 of the filter core 136. For instance, a portion of the first signal 304-1 may be electromagnetically communicated from the first inductor 402-1 to a second inductor 402-2 of the first current balun 134. The second inductor 402-2 of the first current balun 134-1 may propagate the second signal component 604-2 toward and/or from the fourth terminal 404-4 of the first current balun 134-1, which second signal component 604-2 then continues onward to the first core 136 over one or more wires or signal traces.

At block 806, at least a portion of the first signal component is propagated through at least one first resonator of the filter core. For example, the filter circuit 130 can propagate at least a portion of the first signal component 604-1 through at least one first resonator 602-1 of the filter core 136. Here, the first resonator 602-1 may include at least one acoustic wave resonator 702 that converts the electrical signal into an acoustic signal for filtering and then reconverts the filtered acoustic signal into a filtered electrical signal.

At block 808, at least a portion of the second signal component is propagated through at least one second resonator of the filter core. For example, the filter circuit 130 can propagate at least a portion of the second signal component 604-2 through at least one second resonator 602-2 of the filter core 136. Another portion of the second signal component 604-2 may be propagated through at least one other resonator 602, such as the fourth resonator 602-4. In some cases, the multiple signal components may be propagated through multiple resonators disposed on "straight" paths and "crossed" paths that are coupled together into a lattice filter architecture, which is shown in FIG. 6 by way of example only.

At block 810, the at least a portion of the first signal component is electromagnetically routed from a third terminal of the filter core to a second port of the filter circuit as a part of a second signal. For example, the filter circuit 130 can electromagnetically route the at least a portion of the first signal component 604-1 from a third terminal 406-3 of the filter core 136 to a second port 132-2 of the filter circuit 130 as a part of a second signal 304-2. Thus, multiple signal aspects, including the at least a portion of the first signal component 604-1, may be routed to the fourth terminal 404-4 of a second current balun 134-2 and electromagnetically coupled from a second inductor 402-2 of the second current balun 134-2 to a first inductor 402-1 of the second current balun 134-2 and then provided to the second port 132-2 as part of the second signal 304-2.

At block 812, the at least a portion of the second signal component is galvanically routed from a fourth terminal of the filter core to the second port of the filter circuit as another part of the second signal. For example, the filter circuit 130 can galvanically route the at least a portion of the second signal component 604-2 from a fourth terminal 406-4 of the filter core 136 to the second port 132-2 of the filter circuit 130 as another part of the second signal 304-2. This may be performed by, at least in part, the first inductor 402-1 of the second current balun 134-2 via the second terminal 404-2 of the second current balun 134-2. The second current balun 134-2 may also produce the second signal 304-2 having the single-ended form based on (e.g., by combining differential signal components that include) the at least a portion of the first signal component 604-1 and the at least a portion of the second signal component 604-2.

Implementation Examples

This section describes some aspects of example implementations and/or example configurations related to the apparatuses and/or processes presented above.

Example aspect 1: An apparatus comprising:
  a filter circuit comprising:
    a current balun comprising:
      a first terminal coupled to a first port of the filter circuit, a second terminal, a third terminal, and a fourth terminal;
      a first inductor galvanically coupled between the first terminal and the second terminal; and
      a second inductor galvanically coupled between the third terminal and the fourth terminal; and
    a filter core coupled between the current balun and a second port of the filter circuit, the filter core galvanically coupled to the second terminal of the current balun and to the fourth terminal of the current balun.

Example aspect 2: The apparatus of example aspect 1, wherein the filter circuit comprises:
  a resonant circuit coupled between the second terminal of the current balun and a ground.

Example aspect 3: The apparatus of example aspect 2, wherein the resonant circuit comprises:
  an inductor; and
  a capacitor coupled in parallel with the inductor between the second terminal of the current balun and the ground.

Example aspect 4: The apparatus of any one of the preceding example aspects, wherein the filter circuit comprises:
  an inductor coupled between the second terminal of the current balun and the fourth terminal of the current balun.

Example aspect 5: The apparatus of any one of the preceding example aspects, wherein the filter core comprises:
  a first resonator coupled between the second terminal of the current balun and a first node;
  a second resonator coupled between the fourth terminal of the current balun and a second node;
  a third resonator coupled between the second terminal of the current balun and the second node; and
  a fourth resonator coupled between the fourth terminal of the current balun and the first node.

Example aspect 6: The apparatus of example aspect 5, wherein:
  the current balun comprises a first current balun;
  the third terminal of the first current balun is coupled to a ground;
  the filter circuit comprises:
    a second current balun comprising:
      a first terminal coupled to the second port, a second terminal, a third terminal coupled to the ground, and a fourth terminal;
      a first inductor galvanically coupled between the first terminal of the second current balun and the second terminal of the second current balun; and
      a second inductor galvanically coupled between the third terminal of the second current balun and the fourth terminal of the second current balun;
  the second terminal of the second current balun is coupled to the second node; and
  the fourth terminal the second current balun is coupled to the first node.

Example aspect 7: The apparatus of example aspect 6, wherein the filter circuit comprises:
  an inductor coupled between the second terminal of the first current balun and the fourth terminal of the first current balun; and
  another inductor coupled between the second terminal of the second current balun and the fourth terminal of the second current balun.

Example aspect 8: The apparatus of example aspect 6 or example aspect 7, wherein the filter circuit comprises:
  an inductive-capacitive circuit coupled between the second terminal of the first current balun and the ground; and
  another inductive-capacitive circuit coupled between the second terminal of the second current balun and the ground.

Example aspect 9: The apparatus of example aspect 5, wherein:
  the first resonator comprises at least one acoustic wave resonator.

Example aspect 10: The apparatus of example aspect 9, wherein:
  the first resonator comprises multiple acoustic wave resonators that are coupled together in series.

Example aspect 11: The apparatus of example aspect 9, wherein:
  the first resonator comprises multiple acoustic wave resonators that are coupled together in parallel.

Example aspect 12: The apparatus of any one of the preceding example aspects, wherein:
  the filter core comprises a bridge filter.

Example aspect 13: The apparatus of example aspect 12, wherein:
  the bridge filter comprises a lattice filter.

Example aspect 14: The apparatus of any one of the preceding example aspects, wherein the current balun is configured to:
  transform between a single-ended signal at the first port and a differential signal at the filter core.

Example aspect 15: The apparatus of example aspect 14, wherein the current balun is configured to:
  substantially balance a first current flowing through the second terminal of the current balun with a second current flowing through the fourth terminal of the current balun.

Example aspect 16: The apparatus of any one of the preceding example aspects, wherein:
  the third terminal of the current balun is coupled to a ground; and
  the first terminal of the current balun is galvanically coupled to the first port.

Example aspect 17: The apparatus of example aspect 16, wherein:
  the first port comprises a single-ended port.

Example aspect 18: The apparatus of any one of the preceding example aspects, wherein the filter circuit comprises:
  a matching network coupled between the first port and the current balun.

Example aspect 19: The apparatus of any one of the preceding example aspects, further comprising:
  at least one radio-frequency front-end comprising the filter circuit.

Example aspect 20: The apparatus of example aspect 19, further comprising:
  a wireless interface device comprising the at least one radio-frequency front-end;
  a display screen; and
  at least one processor operatively coupled to the display screen and at least a portion of the wireless interface device, the at least one processor configured to present one or more graphical images on the display screen based on one or more wireless signals communicated using the filter circuit of the wireless interface device.

Example aspect 21: An apparatus comprising:
  a filter circuit comprising:
    a first port;
    a second port;
    a filter core coupled between the first port and the second port; and
    a current balun comprising:
      first means for galvanically coupling the filter core to the first port; and
      second means for galvanically coupling the filter core to a ground.

Example aspect 22: The apparatus of example aspect 21, wherein:
  the current balun comprises a first current balun; and
  the filter circuit comprises:
    a second current balun comprising:
      first means for galvanically coupling the filter core to the second port; and
      second means for galvanically coupling the filter core to the ground.

Example aspect 23: The apparatus of example aspect 22, wherein the filter core comprises:
  first means for resonating coupled between the first means for galvanically coupling of the first current balun and the second means for galvanically coupling of the second current balun;
  second means for resonating coupled between the second means for galvanically coupling of the first current balun and the first means for galvanically coupling of the second current balun;
  third means for resonating coupled between the first means for galvanically coupling of the first current balun and the first means for galvanically coupling of the second current balun; and
  fourth means for resonating coupled between the second means for galvanically coupling of the first current balun and the second means for galvanically coupling of the second current balun.

Example aspect 24: The apparatus of any one of example aspects 21 to 23, wherein the filter circuit comprises:
  means for increasing a bandwidth of the current balun, the means for increasing the bandwidth coupled between the first means for galvanically coupling and the ground.

Example aspect 25: The apparatus of any one of example aspects 21 to 24, wherein the filter circuit comprises:
  means for compensating for one or more signal errors introduced by the current balun and for increasing a bandwidth of the filter circuit, the means for compensating for the one or more signal errors and for increasing the bandwidth coupled between the first means for galvanically coupling and the second means for galvanically coupling.

Example aspect 26: A method for operating a filter circuit, the method comprising:
  galvanically routing a first signal component of a first signal from a first port of the filter circuit to a first terminal of a filter core;
  electromagnetically routing a second signal component of the first signal from the first port to a second terminal of the filter core;
  propagating at least a portion of the first signal component through at least one first resonator of the filter core;
  propagating at least a portion of the second signal component through at least one second resonator of the filter core;
  electromagnetically routing the at least a portion of the first signal component from a third terminal of the filter core to a second port of the filter circuit as a part of a second signal; and
  galvanically routing the at least a portion of the second signal component from a fourth terminal of the filter core to the second port of the filter circuit as another part of the second signal.

Example aspect 27: The method of example aspect 26, further comprising:
  converting, using a first current balun, the first signal having a single-ended form into a differential form comprising at least the first signal component and the second signal component; and
  producing, using a second current balun, the second signal having the single-ended form based on the at least a portion of the first signal component and the at least a portion of the second signal component.

Example aspect 28: The method of example aspect 27, further comprising:
  propagating the first signal component and the second signal component across a parallel inductor coupled between the first current balun and the filter core.

Example aspect 29: The method of example aspect 27 or example aspect 28, further comprising:

propagating the first signal component across a shunt resonant circuit that is coupled between the first current balun and the filter core.

Example aspect 30: An apparatus comprising:
a filter circuit comprising:
   a first port;
   a second port;
   a filter core coupled between the first port and the second port, the filter core comprising a bridge filter including at least four acoustic wave resonators;
   a first current balun coupled between the first port and the filter core; and
   a second current balun coupled between the second port and the filter core.

Example aspect 31: The apparatus of example aspect 30, wherein the bridge filter comprises:
   a first acoustic wave resonator coupled between a first terminal of the first current balun and a first terminal of the second current balun;
   a second acoustic wave resonator coupled between a second terminal of the first current balun and a second terminal of the second current balun;
   a third acoustic wave resonator coupled between the first terminal of the first current balun and the second terminal of the second current balun; and
   a fourth acoustic wave resonator coupled between the second terminal of the first current balun and the first terminal of the second current balun.

Example aspect 32: The apparatus of example aspect 30 or example aspect 31, wherein the filter circuit comprises:
   a first inductor coupled between a first terminal of the first current balun and a second terminal of the first current balun; and
   a second inductor coupled between a first terminal of the second current balun and a second terminal of the second current balun.

Example aspect 33: The apparatus of any one of example aspects 30 to 32, wherein the filter circuit comprises:
   a first resonant circuit coupled between a terminal of the first current balun and a ground; and
   a second resonant circuit coupled between a terminal of the second current balun and the ground.

Example aspect 34: The apparatus of example aspect 33, wherein:
   the first resonant circuit comprises an inductor and a capacitor coupled together in parallel between the terminal of the first current balun and the ground; and
   the second resonant circuit comprises an inductor and a capacitor coupled together in parallel between the terminal of the second current balun and the ground.

Example aspect 35: The apparatus of any one of example aspects 30 to 34, wherein:
   the first current balun includes an inductor coupled between the first port and the bridge filter; and
   the second current balun includes an inductor coupled between the second port and the bridge filter.

Example aspect 36: The apparatus of example aspect 35, wherein:
   the inductor of the first current balun is capable of carrying a direct-current (DC) current between the first port and the bridge filter; and
   the inductor of the second current balun is capable of carrying a DC current between the second port and the bridge filter.

CONCLUSION

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire, or an electromagnetic coupling, such as with a transformer. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The term "port" (e.g., including a "first port" or a "filter port") represents at least a point of electrical connection at or proximate to the input or output of a component or between two or more components (e.g., active or passive circuit elements or parts). Although at times a port may be visually depicted in a drawing as a single point (or a circle), the port can represent an inter-connected portion of a physical circuit or network that has at least approximately a same voltage potential at or along the portion. In other words, a single-ended port can represent at least one point (e.g., a node) of multiple points along a conducting medium (e.g., a wire or trace) that exists between electrically connected components. In some cases, a "port" can represent at least one node that represents or corresponds to an input or an output of a component, such as a filter or part thereof. Similarly, a "terminal" may represent one or more points with at least approximately a same voltage potential relative to an input or output of a component.

The terms "first," "second," "third," and other numeric-related indicators are used herein to identify or distinguish similar or analogous items from one another within a given context-such as a particular implementation, a single drawing figure, a given component, or a claim. Thus, a first item in one context may differ from a first item in another context. For example, an item identified as a "first port" in one context may be identified as a "second port" in another context. Similarly, a "first current balun" or a "first terminal" in one claim may be recited as a "second current balun" or a "third terminal," respectively, in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Although implementations for bridge filters have been described in language specific to certain features and/or methods, the subject of the appended claims is not necessarily limited to the specific features or methods described. Rather, the specific features and methods are disclosed as example implementations for bridge filters.

What is claimed is:
1. An apparatus comprising:
   a filter circuit comprising:
      a first current balun comprising:

a first terminal, a second terminal, a third terminal, and a fourth terminal, the first terminal coupled to a first port of the filter circuit, the third terminal coupled to a ground;
a first inductor galvanically coupled between the first terminal and the second terminal; and
a second inductor galvanically coupled between the third terminal and the fourth terminal;
a filter core coupled between the first current balun and a second port of the filter circuit, the filter core galvanically coupled to the second terminal of the first current balun and to the fourth terminal of the first current balun, the filter core comprising: a first resonator coupled between the second terminal of the first current balun and a first node; a second resonator coupled between the fourth terminal of the first current balun and a second node; a third resonator coupled between the second terminal of the first current balun and the second node; and a fourth resonator coupled between the fourth terminal of the first current balun and the first node;
a second current balun comprising:
a first terminal coupled to the second port, a second terminal, a third terminal coupled to a ground, and a fourth terminal, the second terminal of the second current balun is coupled to the second node, and the fourth terminal of the second current balun is coupled to the first node;
a first inductor galvanically coupled between the first terminal of the second current balun and the second terminal of the second current balun; and
a second inductor galvanically coupled between the third terminal of the second current balun and the fourth terminal of the second current balun;
an inductor coupled between the second terminal of the first current balun and the fourth terminal of the first current balun; and
another inductor coupled between the second terminal of the second current balun and the fourth terminal of the second current balun;
a resonant circuit coupled between the second terminal of the first current balun and a ground, the resonant circuit comprising:
an inductor; and
a capacitor coupled in parallel with the inductor between the second terminal of the first current balun and the ground; and
a matching network coupled between the first port and the first current balun.

2. The apparatus of claim 1, wherein the filter circuit comprises:
an inductive-capacitive circuit coupled between the second terminal of the second current balun and the ground.

3. The apparatus of claim 1, wherein:
the first resonator comprises at least one acoustic wave resonator.

4. The apparatus of claim 3, wherein:
the first resonator comprises multiple acoustic wave resonators that are coupled together in series.

5. The apparatus of claim 3, wherein:
the first resonator comprises multiple acoustic wave resonators that are coupled together in parallel.

6. The apparatus of claim 1, wherein:
the filter core comprises a bridge filter.

7. The apparatus of claim 6, wherein:
the bridge filter comprises a lattice filter.

8. The apparatus of claim 1, wherein the first current balun is configured to:
transform between a single-ended signal at the first port and a differential signal at the filter core.

9. The apparatus of claim 8, wherein the first current balun is configured to:
substantially balance a first current flowing through the second terminal of the first current balun with a second current flowing through the fourth terminal of the first current balun.

10. The apparatus of claim 1, wherein:
the third terminal of the first current balun is coupled to a ground; and
the first terminal of the first current balun is galvanically coupled to the first port.

11. The apparatus of claim 10, wherein:
the first port comprises a single-ended port.

12. The apparatus of claim 1, further comprising:
at least one radio-frequency front-end comprising the filter circuit.

13. The apparatus of claim 12, further comprising:
a wireless interface device comprising the at least one radio-frequency front-end;
a display screen; and
at least one processor operatively coupled to the display screen and at least a portion of the wireless interface device, the at least one processor configured to present one or more graphical images on the display screen based on one or more wireless signals communicated using the filter circuit of the wireless interface device.

14. An apparatus comprising:
a filter circuit comprising:
a first port;
a second port;
a filter core coupled between the first port and the second port including a first node and a second node, the filter core comprising a bridge filter including at least four acoustic wave resonators;
a first current balun coupled between the first port and the filter core, the first current balun comprising:
a first terminal, a second terminal, a third terminal, and a fourth terminal, the first terminal coupled to the first port of the filter circuit, the third terminal coupled to a ground;
a first inductor galvanically coupled between the first terminal and the second terminal; and
a second inductor galvanically coupled between the third terminal and the fourth terminal; and
a second current balun coupled between the second port and the filter core, the second current balun comprising:
a first terminal coupled to the second port, a second terminal, a third terminal coupled to the ground, and a fourth terminal, the second terminal of the second current balun is coupled to the second node, and the fourth terminal of the second current balun is coupled to the first node;
a first inductor galvanically coupled between the first terminal of the second current balun and the second terminal of the second current balun; and
a second inductor galvanically coupled between the third terminal of the second current balun and the fourth terminal of the second current balun;
an inductor coupled between the second terminal of the first current balun and the fourth terminal of the first current balun; and another inductor coupled between the second terminal of the second current balun and the fourth terminal of the second current balun;
a first resonant circuit coupled between the second terminal of the first current balun and a ground, the first resonant circuit comprising:
an inductor; and
a capacitor coupled in parallel with the inductor between the second terminal of the first current balun and the ground; and
a matching network coupled between the first port and the first current balun.

15. The apparatus of claim 14, wherein the bridge filter comprises:
a first acoustic wave resonator coupled between the first terminal of the first current balun and the first terminal of the second current balun;
a second acoustic wave resonator coupled between the second terminal of the first current balun and the second terminal of the second current balun;
a third acoustic wave resonator coupled between the first terminal of the first current balun and the second terminal of the second current balun; and
a fourth acoustic wave resonator coupled between the second terminal of the first current balun and the first terminal of the second current balun.

16. The apparatus of claim 14, wherein the filter circuit comprises:
a second resonant circuit coupled between the second terminal of the second current balun and the ground.

17. The apparatus of claim 16, wherein:
the second resonant circuit comprises an inductor and a capacitor coupled together in parallel between the second terminal of the second current balun and the ground.

18. The apparatus of claim 14, wherein:
the inductor of the first current balun is capable of carrying a direct-current (DC) current between the first port and the bridge filter; and
the inductor of the second current balun is capable of carrying a DC current between the second port and the bridge filter.

* * * * *